(12) United States Patent
Bathul et al.

(10) Patent No.: US 7,872,916 B2
(45) Date of Patent: Jan. 18, 2011

(54) DETERMINISTIC-BASED PROGRAMMING IN MEMORY

(75) Inventors: Fatima Bathul, Santa Clara, CA (US); Darlene Gay Hamilton, White Salmon, WA (US); Michael Achter, Mountain View, CA (US); Hagop Artin Nazarian, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 50 days.

(21) Appl. No.: 12/330,928

(22) Filed: Dec. 9, 2008
(Under 37 CFR 1.47)

(65) Prior Publication Data
US 2010/0142284 A1    Jun. 10, 2010

(51) Int. Cl.
*G11C 16/00* (2006.01)
(52) U.S. Cl. .............................. 365/185.19; 365/185.11; 365/185.22
(58) Field of Classification Search ............. 365/185.02
See application file for complete search history.

(56) References Cited

U.S. PATENT DOCUMENTS 7,652,918 B2 *   1/2010   Wan et al. .............. 365/185.03

* cited by examiner

*Primary Examiner*—Tan T. Nguyen
(74) *Attorney, Agent, or Firm*—Turocy & Watson, LLP

(57) ABSTRACT

Systems, methods, and devices that employ deterministic programming techniques to facilitate efficient programming of memory elements in a memory are presented. A memory component comprises an optimized program component that can divide a group of memory elements selected for programming into a desired number of subgroups based in part on respective current threshold voltage levels (Vt) of the memory elements; apply respective program pulses to each memory element in respective subgroups; measure respective Vt levels of memory elements after the pulse; and verify as passed memory elements that meet a target Vt. The optimized program component can divide a subset of memory elements that do not meet the target Vt into a desired number of subgroups based in part on respective current Vt levels of the memory elements and can continue to perform this deterministic programming process until all memory elements are verified as passing for the target Vt.

44 Claims, 13 Drawing Sheets

DETERMINISTIC-BASED PROGRAMMING IN MEMORY

TECHNICAL FIELD

The subject innovation relates generally to memory systems and in particular, to systems, methodologies, and devices that can employ deterministic programming to facilitate programming in a memory.

BACKGROUND

A wide variety of memory devices can be used to maintain and store data and instructions for various computers and similar systems. In particular, flash memory is a type of electronic memory media that can be rewritten and retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and/or NAND flash, for example. NOR flash evolved from electrically erasable read only memory (EEPROM) chip technology, in which, unlike flash, a single byte can be erased; and NAND flash evolved from DRAM technology. Flash memory devices can be less expensive and denser as compared to many other memory devices, meaning that flash memory devices can store more data per unit area.

Flash memory has become popular, at least in part, because it combines the advantages of the high density and low cost of EPROM with the electrical erasability of EEPROM. Flash memory can be used in many portable electronic products, such as cellular phones, computers, voice recorders, thumbnail drives, and the like, as well as in many larger electronic systems, such as automobiles, airplanes, industrial control systems, etc. The fact that flash memory can be rewritten as well as its retention of data without a power source, small size and light weight have all combined to make flash memory devices a useful and popular means for transporting and maintaining data.

Flash memory typically comprises an array of nonvolatile memory cells wherein data (e.g., one or more bits of data) can be stored. One type of flash memory comprises multi-level memory cells (e.g., quad-level memory cells) where each level can be associated with a respective data state. The multi-level memory cells also can comprise more than one memory element in which data can be stored. For example, a quad-level flash memory cell can comprise two memory elements that each can be programmed to four levels resulting in a memory cell that can have sixteen available data states and can store four bits of data. Each level of a multi-level memory cell can have a respective region or window that is associated with a respective data state.

Typically, memory cells can be formed in an array comprising wordlines (WLs) and bitlines (BLs) formed into an array, where memory cells can be located at points where the WLs and BLs intersect. The WLs can be respectively connected with gates of memory cells, and the respective drains and sources of memory cells can be connected with respective BLs. To perform operations, such as program, read, verify, or erase, on memory cells, a desired gate voltage, drain voltage, and source voltage can be applied to a memory cell via the WL and BLs, respectively, to effect the desired operation.

Conventionally, programming of a word of data, page of data, or desired number of bits or elements of data involves applying multiple programming pulses (e.g., voltage pulses) to desired memory elements based on a specified drain voltage, specified gate voltage, and specified program pulse width, where program pulses are applied to desired memory elements (e.g., memory cell comprising of one or more memory elements) until the memory elements are programmed and verified to a target voltage threshold level (target Vt) that can correspond to the desired programming state. However, some memory elements in a memory can be programmed more quickly than other memory elements. As a result, during programming of a group of memory elements when the program pulse applied to each memory element is the same, some memory elements in the group can be programmed to a desired threshold voltage level (Vt) more quickly than others, and additional time is required to program the slower memory elements to the desired Vt.

It is desirable to improve programming speed in a memory. It is also desirable to program memory elements in the memory with tighter final distributions (e.g., Vt distributions), which can facilitate improving reliability of the memory, increasing density of the memory, improving efficiency of the memory, and widening the operating range of memory elements in the memory.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems, methods, and devices that can employ deterministic programming to facilitate optimizing programming in a memory (e.g., flash memory). In one aspect, a memory component can comprise a nonvolatile memory array(s) (e.g., flash memory array) that can contain a plurality of memory cells (e.g., multi-bit, multi-level memory cells) in which data can be stored. In the memory array, memory cells, which can comprise one or more memory elements in which data can be stored, can be respectively associated with WLs and bitlines (BLs) that can be selected and respective voltages can be applied thereto, as desired, to facilitate performing program, read, verify, and/or erase operations on desired memory cells. Each memory cell can comprise a gate, drain, and source, where the gate can be connected to a WL and the drain and source can be connected to respective and adjacent BLs. During programming of a memory element(s) in a memory cell(s), one or more respective program pulses can be applied to the memory element(s) to facilitate increasing the charge level in the memory element(s) to a target threshold voltage level (target Vt) that can correspond to a specified programming state (e.g., data state). The respective program pulses can be based at least in part on the respective voltages applied to the gate and drain of a selected memory element.

In an aspect, the memory component can comprise an optimized program component that can employ deterministic programming to facilitate optimized programming of memory elements in the memory component. In an aspect, during a program operation, when a group (e.g., set) of memory elements are being programmed to a specified threshold voltage level (Vt) (e.g., target Vt), the optimized program component can divide the group of memory elements into a specified number of subgroups (e.g., n subgroups, where n can be a desired integer number) based at least in part on respective current Vt levels (e.g. charge levels, voltage levels) of the memory elements. For example, the optimized program component can divide a group of memory elements into four subgroups, where a first subgroup can comprise memory elements that each have a higher Vt than the memory elements in the other subgroups; a second subgroup that comprises memory elements that each have a higher Vt than the memory elements in the third subgroup and fourth subgroup, but a lower Vt than memory elements in the first subgroup; a third subgroup that comprises memory elements that each have a higher Vt than the memory elements in the fourth subgroup, but a lower Vt than memory elements in the first subgroup and second subgroup; and a fourth subgroup that comprises memory elements that each have a Vt that is lower Vt than memory elements in the first subgroup, second subgroup, and third subgroup.

In an aspect, the optimized program component can set respective program parameters, including drain voltage, gate voltage, and program pulse width, for each subgroup based at least in part on the respective Vt levels of the memory elements in the respective subgroups, where the respective program parameters for one subgroup can be the same or different from the program parameters of another subgroup. The optimized program component can apply respective first program pulses to each of the memory elements based at least in part on respective program parameters associated with each subgroup. The optimized program component can read (e.g., single read measurement) the respective memory elements to determine whether any of the memory elements are at or above the desired Vt, where any memory element that is at or above the desired Vt can be verified as a pass and programming of such memory elements can be complete. Programming can continue with regard to the memory elements that are not verified as a pass for the desired Vt level.

The optimized program component can divide the memory elements that are not verified to pass into a specified number of subgroups (e.g., four subgroups) based at least in part on respective Vt levels of the memory elements after the first program pulse, where, for example, the first subgroup can comprise memory elements that have a higher charge level than memory elements in the other subgroups and the lowest subgroup (e.g., fourth subgroup) can comprise memory elements that have a lower charge level than the other subgroups. Memory elements verified as a pass are not put into any of the programming subgroups and will not receive any more program pulses during the program operation. The optimized program component can set respective program parameters, including drain voltage, gate voltage, and program pulse width, for each subgroup based at least in part on the respective Vt levels of the memory elements in the respective subgroups, where the respective program parameters for one subgroup can be the same or different from the program parameters of another subgroup. The optimized program component can apply a next program pulse to each of the memory elements based at least in part on respective program parameters associated with each subgroup. The optimized program component can read (e.g., single read measurement) the respective memory elements to determine whether any of the memory elements are at or above the desired Vt, where any memory element that is at or above the desired Vt can be verified as a pass and programming of such memory element can be complete. After each program pulse, the optimized program component can continue to divide memory elements that are not verified as a pass with regard to a desired Vt into a specified number of subgroups, set respective program parameters for each subgroup based at least in part on respective Vt levels of memory elements in the respective subgroups, apply respective next program pulse to each of the memory elements in the subgroups based at least in part on respective program parameters of the subgroups, and perform a verify to determine whether any memory elements are verified as a pass with regard to a desired Vt until all memory elements are verified as a pass to the desired Vt level.

In accordance with an embodiment of the disclosed subject matter, the optimized program component can utilize moving reference programming in conjunction with deterministic programming to facilitate improved programming of selected memory elements in the memory component. In one aspect, during programming, the optimized program component can facilitate selecting a desired group of memory cells, comprising one or more memory elements, for programming to a specified data state (e.g. programming level). The optimized program component can facilitate setting a first program verify level (e.g., where a desired program verify level can correspond to a desired Vt level) and dividing the selected memory elements into a predefined number of subgroups based at least in part on respective current Vt levels of the memory elements. Respective first sets of program parameters (e.g., drain voltage, gate voltage, pulse width) associated with the respective first program pulses for each subgroup can be determined and set based at least in part on predefined deterministic program criteria, where the respective drain voltage and respective gate voltage can be respective voltage levels applied to the drains and gates of the selected memory elements, and the pulse width can be the length of time the voltage pulse (e.g., program pulse) is applied to the selected memory elements. The first program verify level and first sets of program parameters can be set, respectively, such that all or a substantial portion (e.g., virtually all) of the selected memory elements will be verified to pass the first program verify level after the respective first program pulses are applied. The respective first program pulses can be applied to each respective subgroup of memory elements to facilitate programming the memory elements to at least the first program verify level.

After the respective first program pulses are applied, the optimized program component can adjust the program verify level to a second program verify level, which can be a higher level than the first program verify level, where the second program verify level can be selected such that all or a substantial portion of the selected memory elements will be verified to pass the second program verify level after the respective second program pulses are applied to memory elements that are below the second program verify level. The optimized program component can evaluate the group of memory elements to determine whether any of the memory elements are already verified as passing the second program verify level. Typically, at least a portion of the group of memory elements already can be verified to pass the second program verify level before the respective second program pulses are applied. The optimized program component can facilitate selecting a subset of the group of memory elements that are below the second program verify level. The memory elements from the group that are already verified to pass the second program verify level do not receive any of the respective second program pulses. The optimized program component can divide the subset of the group of memory elements into a predefined number of subgroups of memory elements based at least in part on respective current Vt levels of the memory elements as measured after the respective first program pulses were applied. The optimized program component can set respective second sets of program parameters (e.g., drain voltage, gate voltage, pulse width) associated with respective second program pulses to be applied to memory elements in each of the respective subgroups based at least in part on predefined deterministic program criteria. The optimized program component can apply respective second program pulses to each of the respective subgroups of memory elements to facilitate passing such memory elements for the second program verify level.

If the second program verify level is not the target program verify level (e.g., corresponding to Vt), which can correspond to the desired data state to which the memory elements are to be programmed, the optimized program component can adjust the program verify level to the next program verify level, where the hybrid deterministic/moving-reference programming process can continue until the group of memory elements are verified to pass the target program verify level, based at least in part on predefined deterministic programming criteria. For instance, the optimized program component can adjust the program verify level to the next program verify level; determine which memory elements have charge levels that are at or above the next program verify level, where such memory elements will not receive the next program pulse; select memory elements that have charge levels (e.g. Vt levels) below the next program verify level and divide the selected memory elements into a predefined number of subgroups of memory elements based at least in part on respective current Vt levels of the memory elements; set respective program parameters for the respective next program pulses for the respective subgroups; apply the respective next program pulses to memory elements in respective subgroups; adjust the program verify level to a subsequent program verify level if the next program verify level is not the target program verify level; and determine whether the memory elements have charge levels that are at or above the applicable program verify level (e.g., subsequent program verify level, target program verify level).

In an aspect, when a subset of memory elements is pulsed, with respective program pulses based at least in part on the subgroup in which each of the memory elements resides, to program those memory elements to the target program verify level, there potentially can be some memory elements that are slower than other elements in reaching the target program verify level, and the slower memory elements may not reach the target program verify level with the expected last program pulse. In such instance, the optimized program component can apply one or more program pulses, if desired, to any memory element that does not reach the target program verify level after the expected last program pulse in order to verify and pass such memory elements to the target program verify level.

The program parameters, the number of subgroups employed during programming, and/or other parameters can be determined based at least in part on predefined deterministic program criteria, which can include, for example, type of memory cell, number of available data levels for each memory element in the memory cell, number of memory elements in a memory cell, respective Vt for particular data level, Vt distribution of the memory element, etc.

In yet another aspect, the optimized program component can facilitate fine tuning (e.g., refining) deterministic programming of memory elements and/or deterministic/moving-reference programming of memory elements based at least in part on predefined deterministic program criteria. The optimized program component can evaluate the efficiency of programming memory elements (e.g., amount of time utilized to program memory elements, number of program pulses applied to memory elements for all memory elements to reach the target Vt level, the tightness of distribution of memory elements with regard to respective Vt levels when programmed, etc.) in the memory component over time. If a parameter, such as programming time, number of program pulses, or Vt distribution, exceeds a respective predetermined threshold level, the optimized program component can facilitate adjusting the particular parameter and/or related parameters (e.g., drain voltage, gate voltage, pulse width, etc.) to facilitate fine tuning the programming process so that the programming process meets desired specifications.

In accordance with still another aspect, methods that can employ deterministic-based (e.g., deterministic programming, deterministic/moving-reference programming) programming of memory elements to facilitate optimizing programming in a memory (e.g. memory component) are presented. In yet another aspect, an electronic device that can comprise a memory component that can employ deterministic-based programming of memory elements to facilitate optimizing programming in the memory component is presented.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
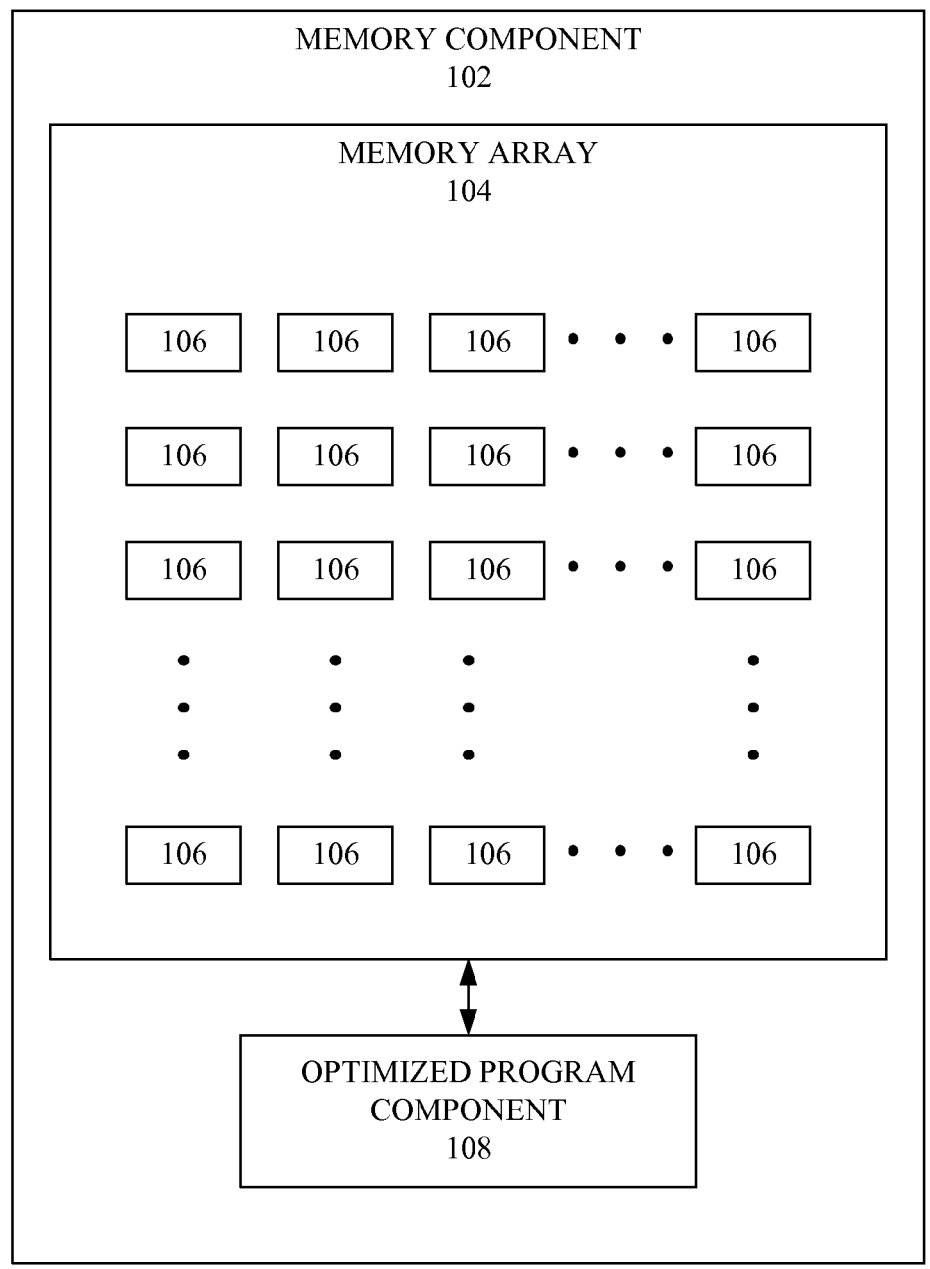
FIG. 1 illustrates a block diagram of a system that can employ deterministic programming to facilitate efficient programming of data in a memory component in accordance with various aspects and embodiments of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, programming of a word of data, page of data, or desired number of bits or elements of data involves applying multiple programming pulses (e.g., voltage pulses) to desired memory elements based in part on a specified drain voltage, specified gate voltage, and specified program pulse width, where program pulses are applied to desired memory elements (e.g., memory element(s) in a memory cell) until the memory elements are programmed and verified to a target voltage threshold level (target Vt) that can correspond to the desired programming state. However, some memory elements in a memory can be programmed more quickly than other memory elements. As a result, during programming of a group of memory elements when the program pulse applied to each memory element is the same, some memory elements in the group can be programmed to a desired threshold voltage level (Vt) more quickly than others, and additional time is required to program the slower memory elements to the desired Vt. It is desirable to improve programming speed in a memory and program memory elements in the memory with tighter final distributions (e.g., Vt distributions). This can facilitate improving reliability of the memory, increasing density of the memory, improving efficiency of the memory, and widening the operating range of memory elements in the memory.

Systems, methods, and devices that employ deterministic programming techniques to facilitate efficient programming of memory elements in a memory are presented. A memory component can comprise an optimized program component that can divide a group of memory elements selected for programming into a desired number of subgroups based in part on respective current threshold voltage levels (Vt) of the memory elements; apply respective program pulses to each memory element in respective subgroups; measure respective Vt levels of memory elements after the pulse; and verify as passed memory elements that meet a target Vt. The optimized program component can select a subset of memory elements that did not meet the target Vt and can divide the subset of memory elements into a desired number of subgroups based in part on respective current Vt levels of the memory elements; apply respective next program pulses to each memory element in respective subgroups; measure respective Vt levels of memory elements after the next program pulse; and verify as passed memory elements that meet a target Vt. The optimized program component can continue with the deterministic programming of the memory elements until all memory elements are verified as passing for the target Vt.

FIG. 1 illustrates a block diagram of a system 100 that can employ deterministic programming to facilitate efficient programming of data in a memory component in accordance with various aspects and embodiments of the subject matter disclosed herein. System 100 can include a memory component 102 that can be comprised of a memory array(s) 104 that can store data, operation code, commands, etc., in individual memory cells 106 in the memory array 104. For instance, in a memory array 104, there can be R memory cells 106, where R can be a desired integer number. Each memory cell 106 can store one or more bits of data (e.g., memory cell having two data states; memory cell having two memory elements that each can employ two data states; multi-level, multi-bit memory cell). In yet another aspect, the memory component 102 can comprise non-volatile memory (e.g. flash memory) and/or volatile memory (e.g., static random access memory (SRAM)), where the memory array(s) 104 can be non-volatile memory. It is to be appreciated and understood that, while one memory component 102 is depicted in system 100, the subject innovation is not so limited, as system 100 can include a plurality of memory components 102. Only one memory component 102 is depicted herein for brevity and clarity.

Figure 6:
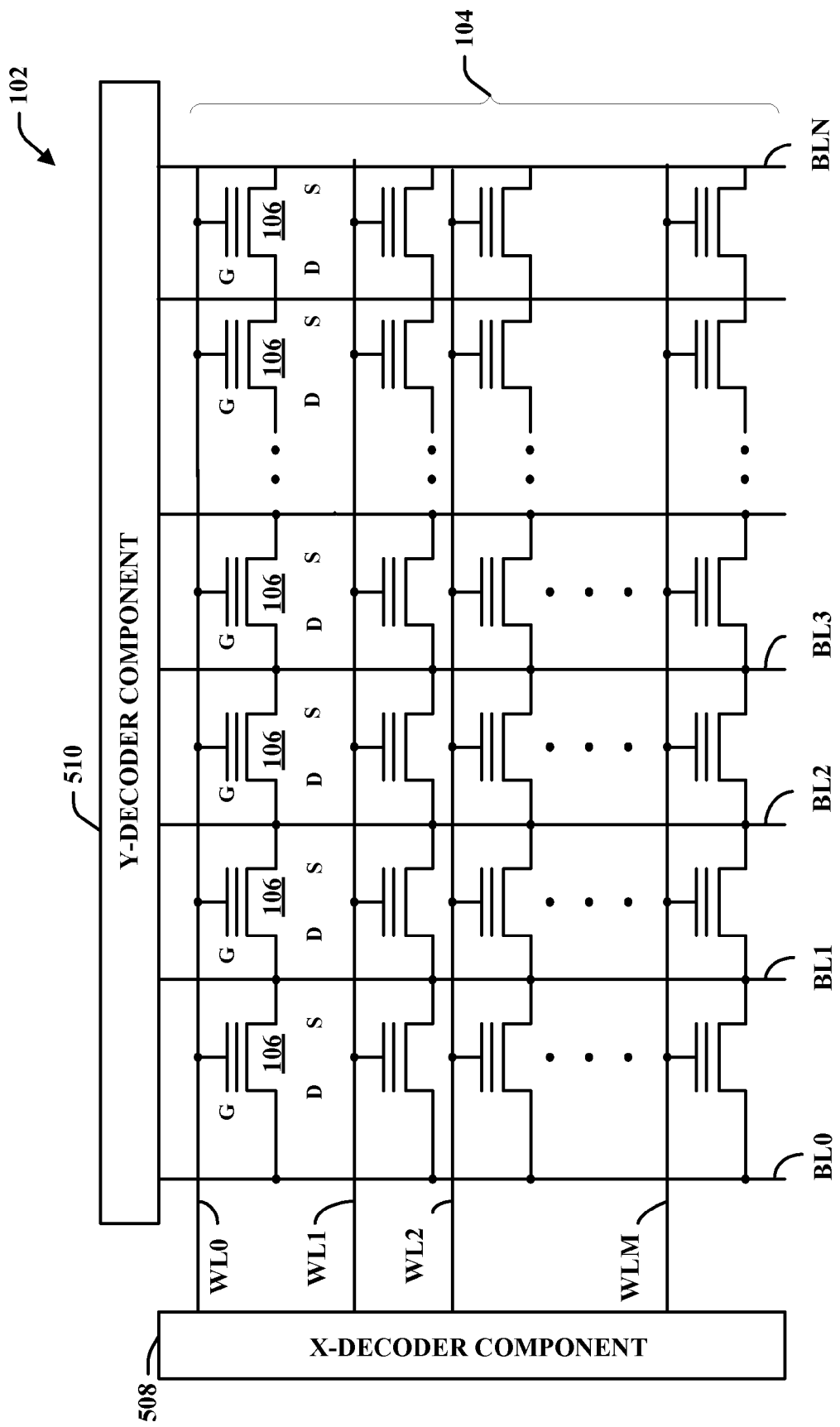
FIG. 6 illustrates a diagram of an example portion of a memory component in accordance with an aspect of the disclosed subject matter.

In an aspect, in the memory array 104, the memory cells 106 can be respectively associated with WLs (e.g., as illustrated in FIG. 6) and BLs (e.g., as illustrated in FIG. 6) that can be selected and respective voltages can be applied thereto, as desired, to facilitate performing program, read, verify, and/or erase operations on desired memory cells 106. Each memory cell 106 can comprise a gate (e.g., as illustrated in FIG. 6), drain (e.g., as illustrated in FIG. 6), and source (e.g., as illustrated in FIG. 6), where the gate can be connected to a WL and the drain and source of the memory cell 106 can be connected to respective and adjacent BLs. A predefined gate voltage can be applied to a gate, a predefined drain voltage can be applied to a drain, and a predefined source voltage can be applied to a source, of a memory cell 106 to facilitate performing a desired operation on the memory cell 106, where the respective voltages can be determined based at least in part on the type of operation being performed on the memory cell 106.

In accordance with an aspect of the disclosed subject matter, the memory component 102 can include an optimized program component 108 that can be associated with the memory array 104 and can facilitate efficient programming of memory elements, where a memory cell 106 can comprise one or more memory elements, in the memory array 104 of the memory component 102. In an aspect, during a program operation, the optimized program component 108 can select a group of memory elements that are desired to be programmed to a specified threshold voltage level (Vt) that can correspond to a specified data state.

Figure 2:
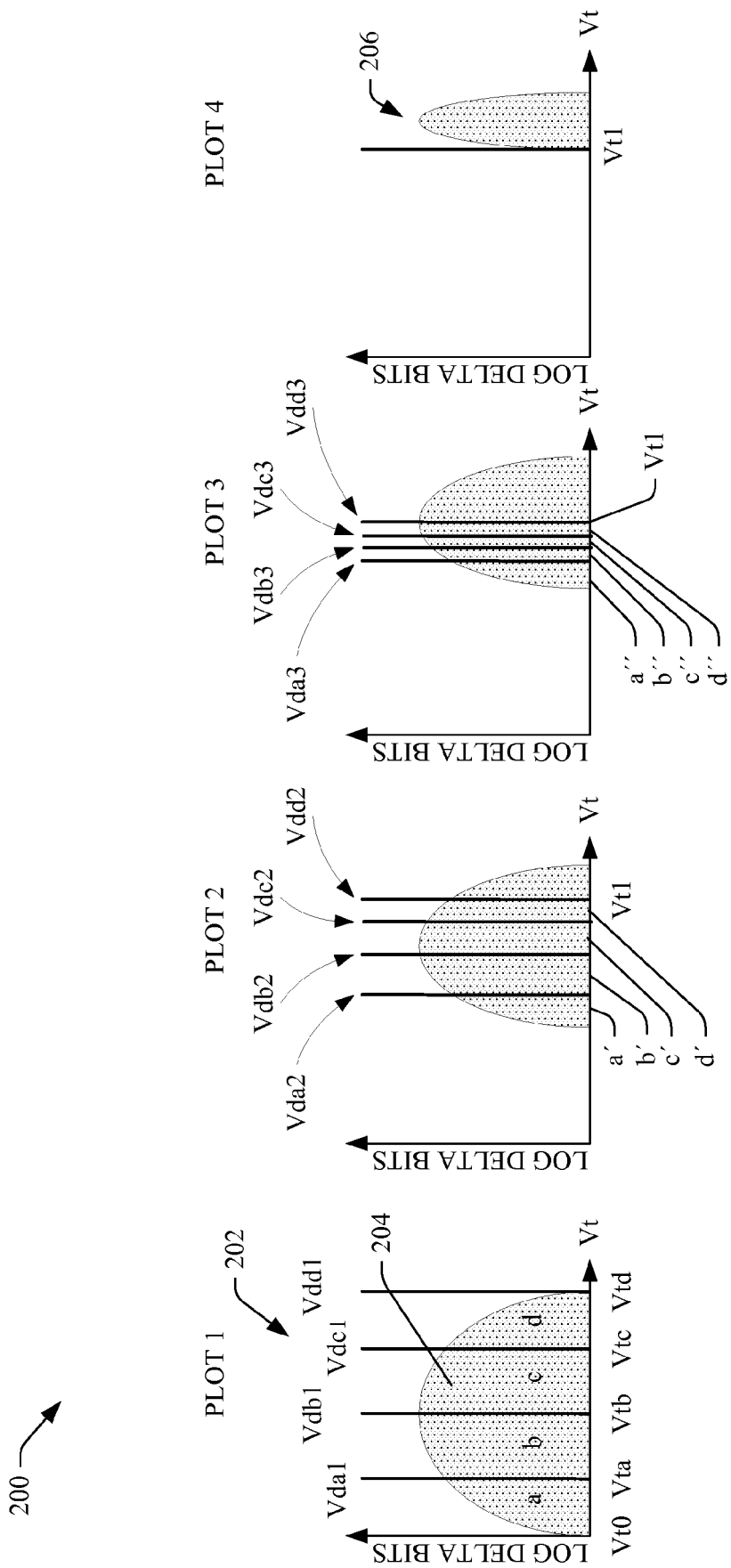
FIG. 2 depicts example Vt distributions related to memory elements being programmed in a memory using deterministic programming in accordance with an aspect of the disclosed subject matter.

Referring briefly to FIG. 2 (and continuing with reference to FIG. 1), depicted are example Vt distributions 200 related to memory elements being programmed in a memory using deterministic programming in accordance with an aspect of the disclosed subject matter. As depicted at 202, the selected memory elements 204 initially can be in an unverified Vt state or an intrinsic Vt state, where the selected memory elements can have a Vt level below the lowest program level. The respective Vt levels of each of the selected memory elements can be read (e.g. single read measurement) to facilitate determining respective current Vt levels of each of the memory elements.

In an aspect, the optimized program component 108 can divide the group of memory elements 204 into a specified number of subgroups (e.g. n subgroups, where n can be a desired integer number) based at least in part on respective current Vt levels of the memory elements 204. For example, the optimized program component 108 can divide a group of selected memory elements 204 into four subgroups (e.g., subgroup a, subgroup b, subgroup c, subgroup d, as depicted in FIG. 2), where a first subgroup (e.g., subgroup d) can comprise memory elements 204 that each have a higher Vt than the memory elements 204 in the other subgroups (e.g., Vt level higher than Vtc, as depicted in FIG. 2); a second subgroup (e.g., subgroup c) that comprises memory elements 204 that each have a higher Vt than the memory elements 204 in the third subgroup (e.g., subgroup b) and fourth subgroup (e.g., subgroup a), but a lower Vt than memory elements in the first subgroup (e.g., Vt level higher than Vtb, but lower than Vtc, as depicted in FIG. 2); a third subgroup that comprises memory elements 204 that each have a higher Vt than the memory elements 204 in the fourth subgroup, but a lower Vt than memory elements 204 in the first subgroup and second subgroup (e.g. Vt level higher than Vta, but lower than Vtb, as depicted in FIG. 2); and the fourth subgroup can comprise memory elements 204 that each have a Vt that is lower Vt than memory elements 204 in the first subgroup, second subgroup, and third subgroup (e.g., Vt level lower than Vta, as depicted in FIG. 2). In an aspect, the subgroups of memory elements each can contain the same number of memory elements 204 or different numbers of memory elements 204, as desired.

In an aspect, the optimized program component 108 can set respective program parameters, including drain voltage, gate voltage, and program pulse width, for each subgroup based at least in part on the respective current Vt levels of the memory elements 204 in the respective subgroups, where the respective program parameters for one subgroup can be the same or different from the program parameters of another subgroup. The optimized program component 108 can apply respect first program pulses (e.g., Vda1, Vdb1, Vdc1, Vdd1, as depicted in Plot 1 of FIG. 2) to each of the memory elements 204 based at least in part on respective program parameters associated with each subgroup. The optimized program component 108 can read (e.g., employing a single read measurement) the respective memory elements 204 to determine whether any of the memory elements 204 are at or above the desired Vt (e.g., target Vt), where any memory element 204 that is at or above the desired Vt can be verified as a pass and programming of such memory element(s) 204 can be complete. Programming can continue with regard to the memory elements 204 that are not verified as a pass for the desired Vt level.

The optimized program component 108 can select the memory elements 204 that are not verified for the desired Vt level. The optimized program component 108 can divide the memory elements 204 that are not verified to pass into a specified number of subgroups (e.g., four subgroups, such as subgroup a', subgroup b', subgroup c', subgroup d', as depicted in Plot 2 of FIG. 2) based at least in part on respective current Vt levels of the memory elements 204 after the first program pulse, where, for example, the first subgroup (e.g., subgroup d') can comprise memory elements 204 that have a higher charge level after the first program pulse than memory elements 204 in the other subgroups and the lowest subgroup (e.g., the fourth subgroup, subgroup a') can comprise memory elements 204 that have a lower charge level after the first program pulse than the other subgroups. Memory elements 204 verified as a pass are not put into any of the programming subgroups and will not receive any more program pulses during the program operation. The optimized program component 108 can set respective program parameters, including drain voltage, gate voltage, and program pulse width, for each subgroup based at least in part on the respective Vt levels of the memory elements 204 in the respective subgroups, where the respective program parameters for one subgroup can be the same or different from the program parameters of another subgroup, and can be the same or different than the program parameters applied during the first program pulse.

The optimized program component 108 can apply a next program pulse (e.g., Vda2, Vdb2, Vdc2, Vdd2, as depicted in Plot 2 of FIG. 2) to each of the memory elements based at least in part on respective program parameters associated with each subgroup. The optimized program component 108 can read (e.g. employing a single read measurement) the respective memory elements 204 to determine whether any of the memory elements 204 are at or above the desired Vt, where any memory element 204 that is at or above the desired Vt can be verified as a pass and programming of such memory element(s) 204 can be complete. After each program pulse, the optimized program component 108 can continue to select a subset of memory elements that are not verified as passing the desired Vt level, divide the subset of memory elements that are not verified as a pass with regard to a desired Vt into a specified number of subgroups (e.g., four subgroups, such as subgroup a", subgroup b", subgroup c", subgroup d", as depicted in Plot 3 of FIG. 2), set respective program parameters for each subgroup based at least in part on respective Vt levels of memory elements 204 in the respective subgroups, apply respective next program pulse to each of the memory elements 204 in the subgroups based at least in part on respective program parameters of the subgroups, and perform a verify to determine whether any memory elements 204 are verified as a pass with regard to a desired Vt, until all selected memory elements 204 are verified as a pass to the desired Vt level (e.g., as depicted in Plot 3 and Plot 4 in FIG. 2), as depicted at 206.

In accordance with an embodiment of the disclosed subject matter, the optimized program component 108 can employ moving reference programming in conjunction with deterministic programming to facilitate improved programming of selected memory elements in the memory component 102. In one aspect, during programming, the optimized program component 108 can facilitate selecting a desired group of memory cells 106, comprising one or more memory elements, for programming to a specified data state (e.g., programming level).

Figure 3A:
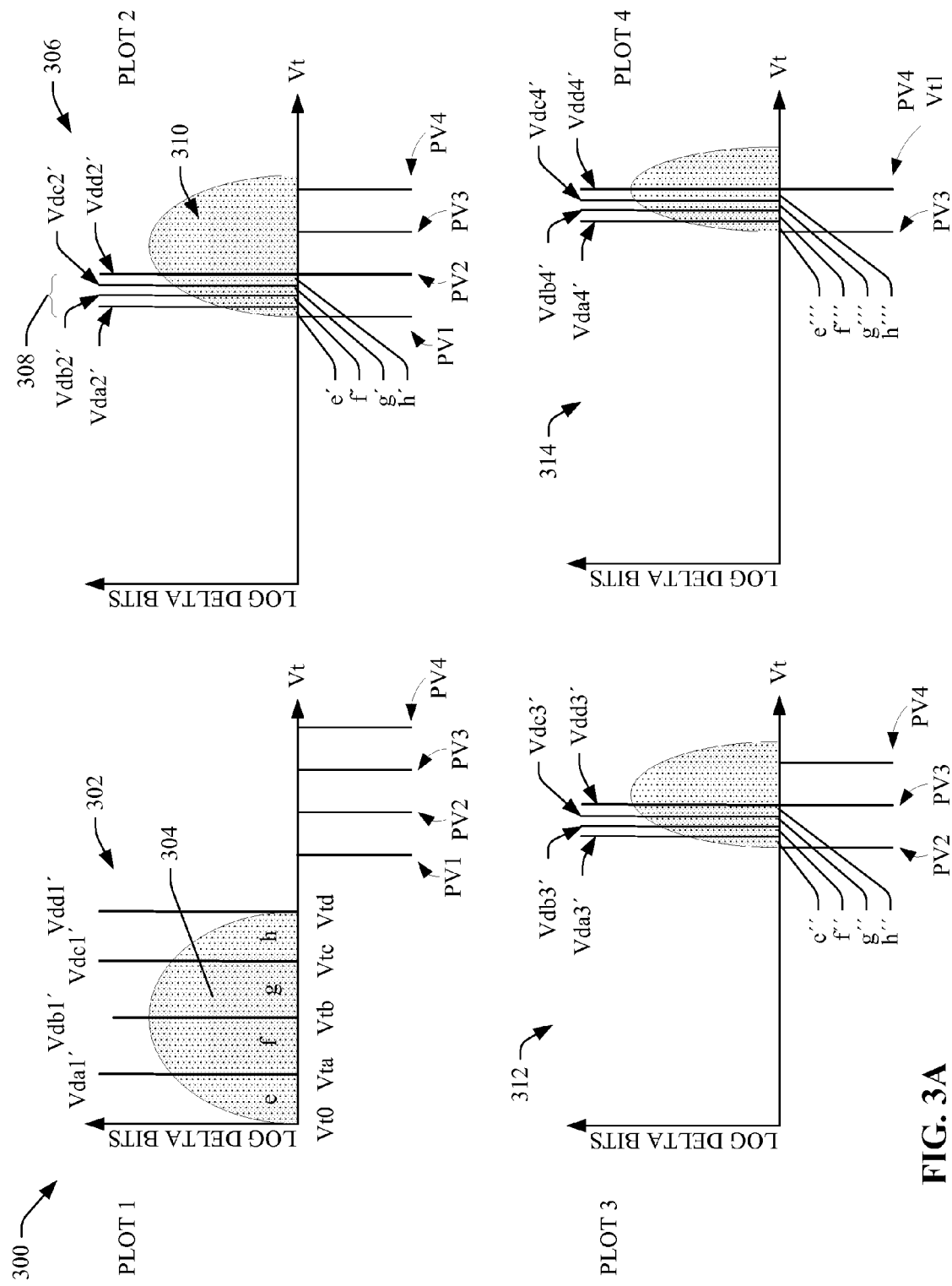
FIGS. 3A and 3B depict example Vt distributions related to memory elements being programmed in a memory using hybrid deterministic/moving-reference programming in accordance with an aspect of the disclosed subject matter.
Figure 3B:
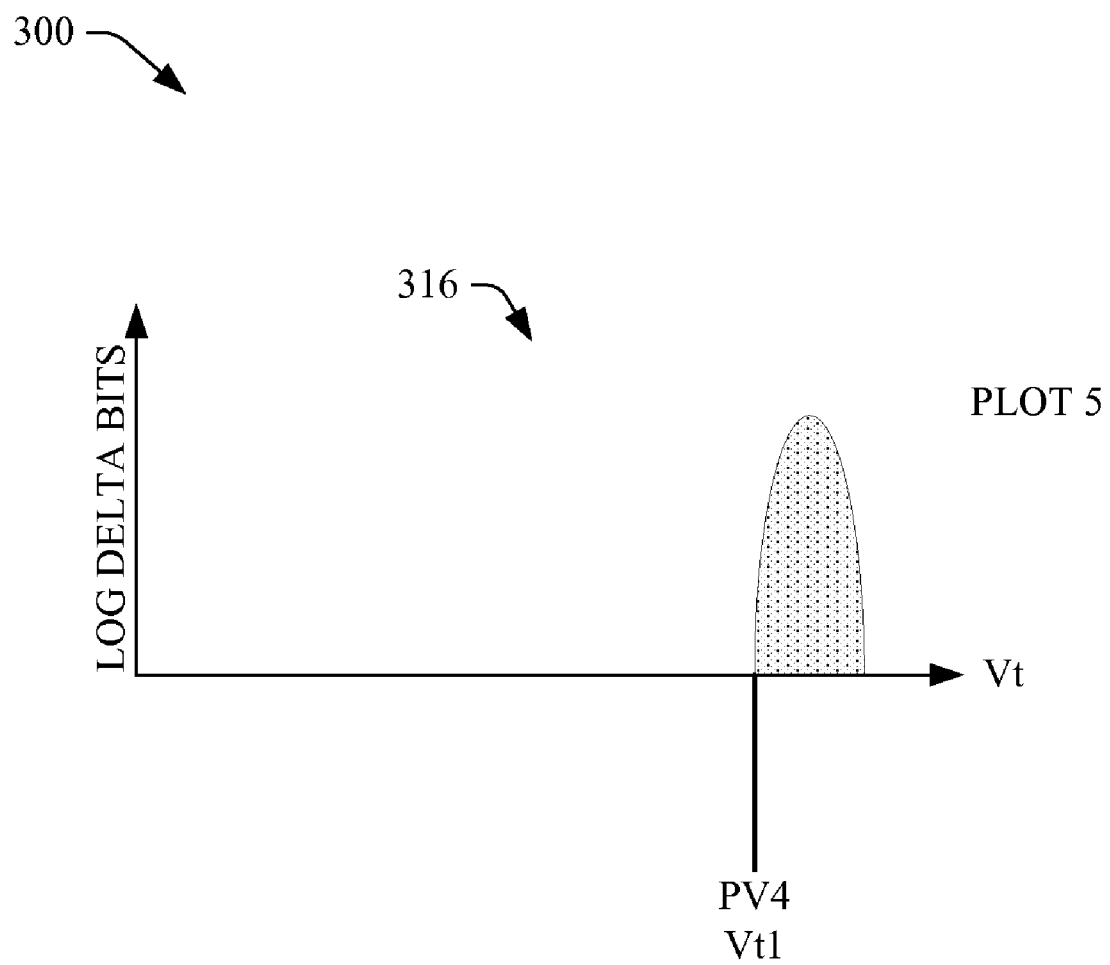

Referring briefly to FIGS. 3A and 3B (and continuing with reference to FIG. 1), depicted are example Vt distributions 300 related to memory elements being programmed in a memory using hybrid deterministic/moving-reference programming in accordance with an aspect of the disclosed subject matter. As illustrated at 302, the selected memory elements 304 initially can be in an unverified Vt state or an intrinsic Vt state, where the selected memory elements can have a Vt level below the lowest program level and a first program verify level (e.g., PV1 as depicted in FIG. 3A; where a desired program verify level can correspond to a desired Vt level). The respective Vt levels of each of the selected memory elements can be read (e.g., single read measurement) to facilitate determining respective current Vt levels of each of the memory elements.

In an aspect, the optimized program component 108 can facilitate setting a first program verify level (e.g., PV1) and dividing the selected memory elements into a predefined number of subgroups based at least in part on respective current Vt levels of the memory elements. For example, the optimized program component 108 can divide a group of selected memory elements 304 into four subgroups (e.g., subgroup e, subgroup f, subgroup g, subgroup h, as depicted at 302 in FIG. 3A), where a first subgroup (e.g., subgroup h) can comprise memory elements 304 that each have a higher Vt than the memory elements 304 in the other subgroups (e.g., Vt level higher than Vtc, as depicted at 302 in FIG. 3A); a second subgroup (e.g., subgroup g) that comprises memory elements 304 that each have a higher Vt than the memory elements 304 in the third subgroup (e.g. subgroup f) and fourth subgroup (e.g. subgroup e), but a lower Vt than memory elements 304 in the first subgroup (e.g., Vt level higher than Vtb, but lower than Vtc, as depicted at 302 in FIG. 3A); the third subgroup (e.g., subgroup f) comprises memory elements 304 that each have a higher Vt than the memory elements 304 in the fourth subgroup, but a lower Vt than memory elements 304 in the first subgroup and second subgroup (e.g., Vt level higher than Vta, but lower than Vtb, as depicted at 302 in FIG. 3A); and the fourth subgroup can comprise memory elements 304 that each have a Vt that is lower Vt than memory elements 304 in the first subgroup, second subgroup, and third subgroup (e.g., Vt level lower than Vta, as depicted at 302 in FIG. 3A). In an aspect, the subgroups of memory elements each can contain the same number of memory elements 304 or different numbers of memory elements 304, as desired.

In an aspect, respective first sets of program parameters (e.g., drain voltage, gate voltage, pulse width) associated with the respective first program pulses for each subgroup can be determined and set based at least in part on predefined deterministic program criteria, where respective drain voltages and respective gate voltages can be respective voltage levels applied to the drains and gates of the selected memory elements, and the pulse width can be the length of time the voltage pulse (e.g., program pulse) is applied to the selected memory elements. The first program verify level and first sets of program parameters can be set, respectively, such that all or a substantial portion (e.g., virtually all) of the selected memory elements will be verified to pass the first program verify level after the respective first program pulses are applied. The optimized program component 108 can apply respective first program pulses (e.g., Vda1', Vdb1', Vdc1', Vdd1', as depicted at 302 in Plot 1 of FIG. 3A) to memory elements in each respective subgroup to facilitate programming the memory elements to at least the first program verify level.

After the respective first program pulses are applied, the optimized program component 108 can adjust the program verify level to a next program verify level (e.g., PV2, as illustrated in Plot 2 at 306 in FIG. 3A), which can be a higher level than the first program verify level, where the next program verify level can be selected such that all or a substantial portion of the selected memory elements will be verified to pass the next program verify level after the respective next program pulses are applied to memory elements that are below the next program verify level. The optimized program component 108 can evaluate the group of memory elements to determine whether any of the memory elements are already verified as passing the next program verify level. Typically, at least a portion of the group of memory elements already can be verified to pass the next program verify level before the respective next program pulses are applied. The optimized program component 108 can facilitate selecting a subset of the group of memory elements that are below the next (e.g., second) program verify level (e.g., memory elements below PV2, as illustrated at 308 in Plot 2 of FIG. 3A). The memory elements from the group that are already verified to pass the next program verify level do not receive any of the respective next (e.g., second) program pulses (e.g., memory elements at or above PV2, as illustrated at 310 in Plot 2 of FIG. 3A). The optimized program component 108 can divide the subset of the group of memory elements into a predefined number of subgroups of memory elements (e.g., four subgroups, such as subgroup e', subgroup f', subgroup g', subgroup h', as depicted at 306 in Plot 2 of FIG. 3A), based at least in part on respective current Vt levels of the memory elements as measured after the respective first program pulses were applied. The optimized program component 108 can set respective next sets of program parameters (e.g., drain voltage, gate voltage, pulse width) associated with respective next program pulses to be applied to memory elements in each of the respective subgroups based at least in part on predefined deterministic program criteria. The optimized program component 108 can apply respective next program pulses (e.g., Vda2', Vdb2', Vdc2', Vdd2', as depicted in Plot 2 of FIG. 3A) to each of the respective subgroups of memory elements to facilitate passing such memory elements for the next program verify level.

If the next program verify level is not the target program verify level (e.g. corresponding to the target Vt), which can correspond to the desired data state to which the memory elements are to be programmed, the optimized program component 108 can adjust the program verify level to a next program verify level (e.g., PV3, as illustrated at 312 in Plot 3 of FIG. 3A; or PV4, as illustrated at 314 in Plot 4 of FIG. 3A, if the previous program verify level was PV3), where the hybrid deterministic/moving-reference programming process can continue until the group of memory elements are verified to pass the target program verify level (e.g., corresponding to the target Vt), based at least in part on predefined deterministic programming criteria. For instance, the optimized program component 108 can adjust the program verify level to a next program verify level; determine which memory elements have charge levels that are at or above that next program verify level, where such memory elements will not receive a next program pulse; select memory elements that have charge levels (e.g. Vt levels) below that next program verify level and divide the selected memory elements into a predefined number of subgroups of memory elements based at least in part on respective current Vt levels of the memory elements (e.g., four subgroups, such as subgroup e", subgroup f", subgroup g", subgroup h", of memory elements that are below PV3, as depicted at 312 in Plot 3 of FIG. 3A; four subgroups, such as subgroup e'", subgroup f'", subgroup g'", subgroup h'", of memory elements that are below PV4, as depicted at 314 in Plot 4 of FIG. 3A); set respective program parameters for the respective next program pulses for the respective subgroups; apply the respective next program pulses (e.g., Vda3', Vdb3', Vdc3', Vdd3', as depicted at 312 in Plot 3 of FIG. 3A; or Vda4', Vdb4', Vdc4', Vdd4', as depicted at 314 in Plot 4 of FIG. 3A, if the current program verify level is PV4) to memory elements in respective subgroups; adjust the program verify level to a subsequent program verify level if the next program verify level is not the target program verify level; and determine whether the memory elements have charge levels that are at or above the applicable program verify level (e.g. subsequent program verify level, target program verify level) (e.g., as depicted in Plot 3 and Plot 4 of FIG. 3A). The optimized program component 108 can continue deterministic/moving-reference programming of selected memory elements until the selected memory elements are programmed to a desired data state, such that the memory elements are verified as passing the target Vt level (e.g., as depicted at 316 in Plot 5 of FIG. 3B).

In an aspect, when a subset of memory elements is program pulsed, with respective program pulses based at least in part on the subgroup in which each of the memory elements resides, to program those memory elements to the target program verify level, there potentially can be some memory elements that are slower than other elements in reaching the target program verify level, and the slower memory elements may not reach the target program verify level with the expected last program pulse. In such instance, the optimized program component 108 can apply one or more program pulses (e.g., additional program pulse(s)), if desired, to any memory element that does not reach the target program verify level after the expected last program pulse in order to verify and pass such memory elements to the target program verify level (e.g., corresponding to the target Vt level).

The program parameters, the number of subgroups employed during programming, and/or other parameters can be determined based at least in part on predefined deterministic program criteria, which can include, for example, type of memory cell, number of available data levels for each memory element in the memory cell, number of memory elements in a memory cell, respective Vt for particular data level, Vt distribution of the memory element, etc.

In yet another aspect, the optimized program component 108 can facilitate fine tuning (e.g., refining) deterministic programming of memory elements and/or deterministic/moving-reference programming of memory elements based at least in part on predefined deterministic program criteria. The optimized program component 108 can evaluate the efficiency of programming memory elements (e.g. amount of time utilized to program memory elements, number of program pulses applied to memory elements for all memory elements to reach the target Vt level, the tightness of distribution of memory elements with regard to respective Vt levels when programmed, etc.) in the memory component 102 over time. If a parameter, such as programming time, number of program pulses, or Vt distribution, exceeds a respective predetermined threshold level, the optimized program component 108 can facilitate adjusting the particular parameter and/or related parameters (e.g., drain voltage, gate voltage, pulse width, etc.) to facilitate fine tuning the programming process so that the programming process can meet desired specifications.

Referring again to the memory component 102, the nonvolatile memory can include, but is not limited to, flash memory (e.g., single-bit flash memory, multi-bit flash memory), read-only memory (ROM), mask-programmed ROM, programmable ROM (PROM), Erasable PROM (EPROM), Ultra Violet (UV)-erase EPROM, one-time programmable ROM, electrically erasable PROM (EEPROM), phase change memory (PCM), and/or nonvolatile RAM (e.g., ferroelectric RAM (FeRAM)). A flash memory can comprise NAND memory and/or NOR memory, for example. Volatile memory can include, but is not limited to, random access memory (RAM), SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

It is to be appreciated and understood that, while the disclosed subject matter referred to an example of dividing a group of selected memory elements into four subgroups, the subject innovation is not so limited, as, in accordance with the subject innovation, the number of subgroups (e.g. subsets) of memory elements into which a group of selected memory elements can be divided during deterministic-based programming (e.g., deterministic programming, hybrid deterministic/moving-reference programming) can virtually any desired number (e.g., integer number). Also, the number of subgroups employed during a deterministic-based program operation can vary between program pulses (e.g. initially can have four subgroups of memory elements, but after the respective first program pulses are applied, the memory elements can be divided into three subgroups and respective second program pulses can be applied to the memory elements, etc.) Further, the respective numbers of memory elements in each group can be the same or different as desired. Program parameters and associated program pulses can be the same or different with respect to disparate subgroups of memory elements and/or disparate portions of the deterministic-based program operation (e.g. program parameters employed for a subgroup of memory elements for a first program pulse can be the same or different than the program parameters employed for the subgroup during a disparate program pulse).

Figure 4:
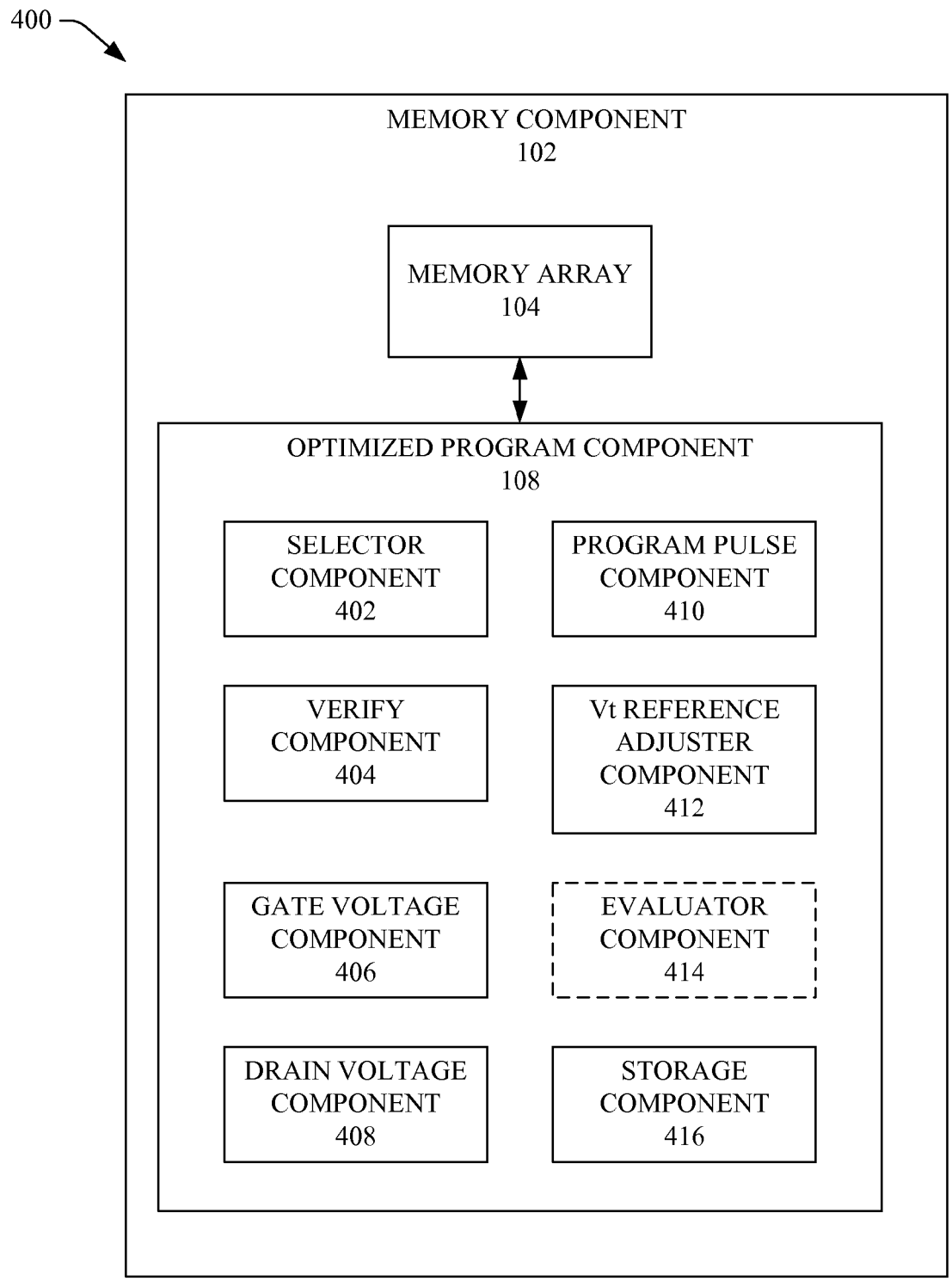
FIG. 4 illustrates a block diagram of a system that can employ deterministic-based programming to facilitate efficient programming associated with a memory component in accordance with an aspect of the disclosed subject matter.

FIG. 4 illustrates a block diagram of a system 400 that can employ deterministic-based programming to facilitate efficient programming associated with a memory component in accordance with an aspect of the disclosed subject matter. System 400 can comprise a memory component 102 that can be utilized to store data. The memory component 102 can include a memory array 104 that can contain a plurality of memory cells 106 (not shown in FIG. 4; e.g., as illustrated in FIG. 1 and described herein), where each memory cell 106 can comprise one or more memory elements (not shown) that can each store one or more bits of data. The memory component 102 can further contain an optimized program component 108 that can employ deterministic-based programming (e.g., deterministic programming, hybrid deterministic/moving-reference programming) to facilitate efficient programming associated with the memory component 102. It is to be appreciated and understood that the memory component 102, memory array 104, memory cells 106, and optimized program component 108, each can be the same or similar as, and/or can comprise the same or similar respective functionality as, respective components, such as more fully described herein, for example, with regard to system 100.

In accordance with an aspect, the optimized program component 108 can include a selector component 402 that can facilitate selecting a memory cell(s) 106, or memory element(s) therein, that is to be programmed using deterministic-based programming based at least in part on a program command received by the memory component 102. The selector component 402 also can facilitate selecting a subset of memory cell(s) 106, or memory element(s) therein, that are not verified as a pass with regard to an applicable Vt level after a program pulse has been applied to such memory cell(s) 106, or memory element(s) therein.

In accordance with an aspect, the optimized program component 108 can include a verify component 404 that can facilitate performing a verify operation on a selected memory cell(s) 106, or memory element(s) therein, to verify that the selected memory cell(s) 106, or memory element(s) therein, has passed for an applicable Vt level during programming and/or to facilitate determining in which subgroup a memory cell(s) 106 or memory element(s) belongs before respective program pulses are applied or between program pulses. For instance, the verify component 404 can perform a single read to measure the Vt levels of respective memory elements before respective first program pulses are applied or between program pulses to facilitate determining in which subgroup a memory element(s) belongs and/or whether any of the memory elements are verified as passing an applicable Vt level.

In yet another aspect, the optimized program component 108 can employ a gate voltage component 406 that can facilitate setting, adjusting, and/or applying respective gate voltages to memory cells 106, or a memory element(s) within a memory cell(s) 106, in the memory component 102 based at least in part on an operation (e.g., read, verify, program, erase) that is to be performed on a desired memory cell(s) 106. For instance, during an operation, such as a program operation, the gate voltage component 406 can facilitate setting and/or applying a predefined gate voltage to a WL (e.g., as illustrated in FIG. 6) connected to a selected memory cell 106 on which the desired operation is to be performed.

In still another aspect, the optimized program component 108 also can contain a drain voltage component 408 that can facilitate setting, adjusting, and/or applying a predefined drain voltage to desired memory cells 106, or a memory element(s) within a memory cell(s) 106, to facilitate performing a desired operation on the desired memory cells 106. The optimized operation component 108 can further contain a program pulse component 410 that can facilitate applying respective predefined program pulse(s) having a predefined pulse width(s) to desired memory cells 106, or a memory element(s) within a memory cell(s) 106, to facilitate performing a desired operation on the desired memory cells 106 based at least in part respective drain voltages and gate voltages being applied to respective memory cells 106. For instance, the respective predefined program pulse(s) applied to a particular memory element can be based at least in part on the subgroup of memory elements to which the particular memory element belongs.

In an aspect, the optimized program component 108 can include a Vt reference adjuster component 412 that can facilitate adjusting a Vt reference level (or program verify level) to a desired Vt level (or corresponding program verify level) during a program operation. For instance, when the optimized program component is employing hybrid deterministic/moving-reference programming, the Vt reference adjuster component 412 can facilitate adjusting the Vt level (or corresponding program verify level) to a next Vt level (or corresponding next program verify level) between each program pulse applied to memory elements until a target Vt level (or corresponding target program verify level) is reached.

In accordance with one embodiment, the optimized operation component 108 optionally can contain an evaluator component 414 that can monitor, measure, and evaluate parameters, such as programming parameters (e.g., drain voltage level, gate voltage level, pulse width, number of program pulses applied during programming, number of subgroups into which selected memory elements are divided, etc.) associated with the memory component 102, based at least in part on predefined deterministic program criteria. The evaluator component 414 can perform evaluations during each program operation or can perform evaluations periodically (e.g., every 10 operations, every 100 operations, every 1000 operations, . . . ), as desired, and/or can perform an evaluation when a programming error is detected. If the evaluator component 414 determines that a particular parameter(s) exceeds an applicable predetermined maximum threshold level or is below an applicable predetermined minimum threshold level, the evaluator component 414 can facilitate determining a desired level or value for a parameter(s) that does not meet the applicable threshold level(s) or another parameter(s) related to the parameter(s), wherein adjustment of the other parameter(s) can facilitate adjusting the parameter(s) to a desired level or value, based at least in part on predefined deterministic program criteria. The evaluator component 414 can operate in conjunction with the gate voltage component 406, drain voltage component 408, program pulse component 410, Vt reference adjuster component 412, and/or other components, to facilitate adjusting the parameter(s) that does not meet the applicable threshold level(s) or another parameter(s) related to the parameter(s), wherein adjustment of the other parameter(s) can facilitate adjusting the parameter(s) to a desired level or value, based at least in part on predefined deterministic program criteria.

The optimized operation component 108 also can include a storage component 416 that can store data, code, commands, etc., related to performing operations on memory cells 106. For instance, the storage component 416 can store information related to setting and/or adjusting parameters, such as program parameters, applying program pulses to selected memory elements, and/or verifying memory elements as a pass for an applicable Vt level, during a program operation. The storage component 416 can comprise volatile memory, such as, for example, RAM, SRAM, DRAM, SDRAM, DDR SDRAM, ESDRAM, SLDRAM, RDRAM, DRDRAM, and/or RDRAM. It is to be appreciated and understood that the selector component 402, verify component 404, gate voltage component 406, drain voltage component 408, program pulse component 410, Vt reference adjuster component 412, optional evaluator component 414, and storage component 416, each can be a stand-alone unit, can be included within the optimized program component 108 (as depicted), can be incorporated within another component, and/or virtually any suitable combination thereof, as desired.

Figure 5:
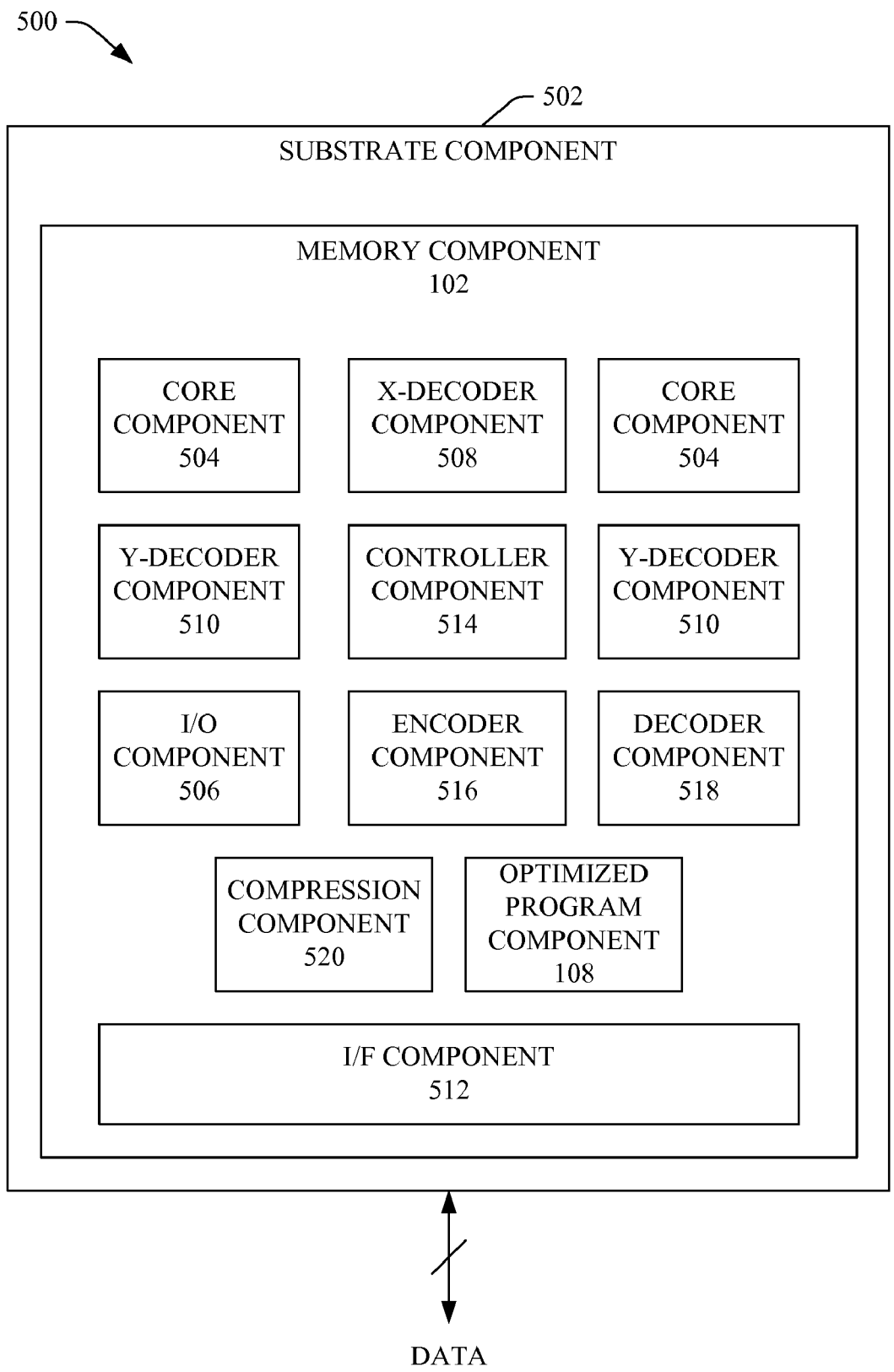
FIG. 5 depicts a block diagram of a memory device that can employ deterministic-based programming to facilitate efficient programming of data in a memory device in accordance with an aspect of the disclosed subject matter.

Turning to FIG. 5, depicted is a block diagram of a memory device 500 that can employ deterministic-based programming to facilitate efficient programming of data in a memory device in accordance with an aspect of the disclosed subject matter. Memory device 500 can comprise a memory component 102 that can comprise a non-volatile memory (e.g. flash memory) and/or volatile memory (e.g. SRAM). The memory component 102 can receive information, including data, commands, and/or other information, which the memory component 102 can process (e.g., store data, execute commands, etc.). The memory component 102 can include a memory array(s) 104 (not shown in FIG. 5; e.g., as illustrated in FIG. 1 and described herein) that can comprise a plurality of memory cells (e.g., 106) (not shown in FIG. 5; e.g. as illustrated in FIG. 1 and described herein) in which data can be stored. The memory component 102 can also comprise an optimized program component 108 that can employ deterministic-based programming (e.g., deterministic programming, hybrid deterministic/moving-reference programming) to facilitate efficient programming associated with the memory component 102. It is to be appreciated and understood that the memory component 102, memory array 104, memory cells 106, and optimized program component 108, each can be the same or similar as, and/or can comprise the same or similar respective functionality as, respective components, such as more fully described herein, for example, with regard to system 100 and system 400.

In one aspect, the memory component 102, including the memory array 104 and optimized program component 108, and other components described herein, for example, with regard to memory device 500 can be formed and/or contained on a substrate component 502 (e.g., semiconductor substrate). In another aspect, one or more core components 504 (e.g., high-density core regions) and one or more lower-density peripheral regions can be formed on the substrate 502. The core component(s) 504 typically can include one or more M by N arrays (e.g., memory array 104) of individually addressable, substantially identical multi-bit memory cells (e.g., 106).

The lower-density peripheral regions can typically include an input/output component 506 (e.g., input/output (I/O) circuitry) and programming circuitry for selectively addressing the individual memory cells 106. The programming circuitry can be represented in part by and can include one or more x-decoder components 508 and one or more y-decoder components 510 that can cooperate with the I/O component 506 for selectively connecting a source (not shown), gate (not shown), and/or drain (not shown) of selected addressed memory cells 106 to predetermined voltages or impedances to effect designated operations (e.g., programming, reading, verifying, erasing) on the respective memory cells 106, and deriving necessary voltages to effect such operations. For example, an x-decoder component 508 and a y-decoder component 510 can each receive address bus information, which can be provided as part of a command, and such information can be utilized to facilitate determining the desired memory cell(s) 106 in the memory component 102.

Figure 7:
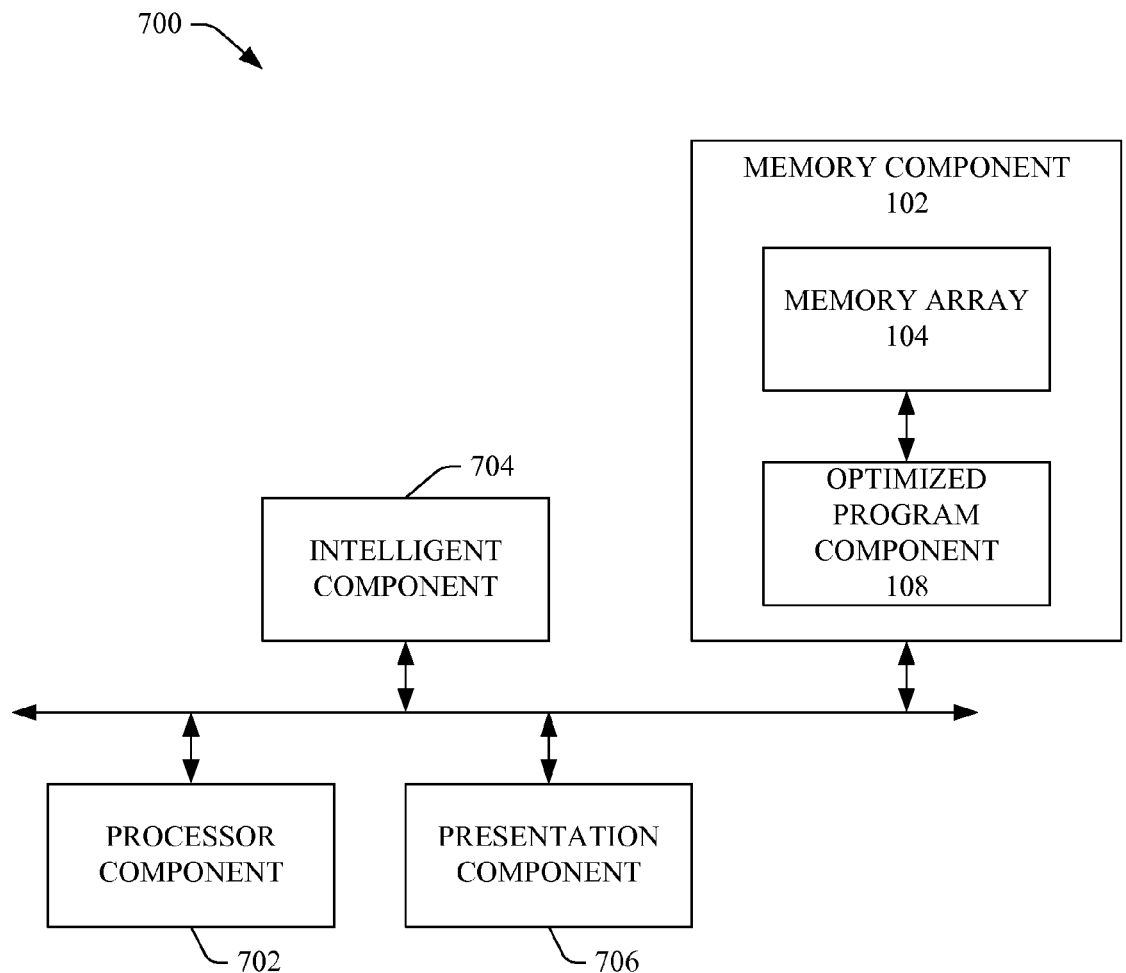
FIG. 7 depicts a block diagram of a system that can employ intelligence to facilitate deterministic-based programming associated with a memory in accordance with an embodiment of the disclosed subject matter.

The memory component 102 can receive information (e.g., data, commands, etc.) via an interface component 512 (also referred to herein as "I/F 512"), which can also be formed on substrate 502. I/F 512 can include and/or provide various adapters, connectors, channels, communication paths, etc. to integrate the memory component 102 into virtually any operating and/or database system(s) and/or with another system(s). In addition, I/F 512 can provide various adapters, connectors, channels, communication paths, etc., that can provide for interaction and/or communication with a processor component (e.g., as depicted in FIG. 7 and described herein), and/or any other component, data, and the like, associated with the memory device 500.

In another aspect, the memory device can include a controller component 514 that can be formed on substrate 502. The controller component 514 can facilitate control of the flow of data to and from the memory component 102. In an aspect, the controller component 514 can facilitate execution of operations (e.g. read, write, verify, erase) associated with memory cells 106 in the memory array 104 based at least in part on received commands.

The memory component 102 can also contain an encoder component 516 that can facilitate encoding data being programmed to the memory component 102, where the encoder component 516 also can be formed on the substrate 502. For example, the encoder component 516 can facilitate converting a digital signal to an analog signal (e.g., current level) to facilitate programming data in the storage locations (e.g., memory cells 106) in the memory component 102.

The memory component 102 can further include a decoder component 518 that can facilitate decoding data being read from the memory component 102. The decoder component 518 can receive an analog signal associated with data, where the analog signal can be stored in the storage location in the memory array 104, and can facilitate converting the analog signal to a digital signal, so that such digital signal representing the read data can be provided to another component (e.g., processor component) for further processing.

Memory component 102 can further include a compression component 520 that can be formed on substrate 502 and can be used to facilitate the compression and decompression of data and/or code to be stored in the memory array 104, to facilitate reducing and/or minimizing the consumption of the available memory in the memory array 104. For example, in response to a request by a host processor (e.g., processor component 702, as illustrated in FIG. 7 and described herein) to read data (e.g., MP3 file) from the memory component 102, the requested data can be retrieved from the memory array 104, with the compression component 520 being used to facilitate de-compression of the data being read from the memory array 104. The de-compressed data can be provided by the memory component 102 to the host processor. In another aspect, the compression component 520 can be used to compress data being received from a host processor for storage in the memory array 104, with the compression component 520 compressing the data before storing the data in a specified location in the memory array 104. Common forms of data compression include algorithms based upon the Lempel-Ziv (LZ) compression method including LZ-Welch, LZ-Renau, and Huffman. Data compression techniques can be "lossy" or "lossless", where "lossy" compression can involve the loss of information between the source code and the compressed code and can be an acceptable effect in such applications as image and sound files, and "lossless" compression schemes can be reversible, allowing the original data to be fully reconstructed. Choice between the use of "lossy" vs. "lossless" compression can depend in part upon the application and file type to be compressed.

In one aspect, memory device 500 can also include a bus (not shown) that can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

FIG. 6 illustrates a diagram of an example portion of a memory component 102 in accordance with an aspect of the disclosed subject matter. The portion of the memory component 102 can comprise a memory array 104 that can include a plurality of memory cells 106 that each can be comprised of a drain (D), gate (G), and source (S). It is to be understood that, as desired, the drain also can act as a source, and the source can act as a drain, depending in part on the operation being performed on the memory cell 106. Each memory cell 106 can have one or more data levels (e.g. 4 data levels) therein and can thereby store one or more bits of data therein. In another aspect, each memory cell 106 can comprise multiple memory elements that each can be programmed to a respective data level. For example, in accordance with an embodiment, a memory cell 106 can comprise two memory elements that each can be set to one of four available data levels, thereby allowing the memory cell 106 to have sixteen available data states corresponding to four bits of data storage available.

In an aspect, the memory array 104 can be associated with an X-decoder component 508 (e.g., WL decoder) and a Y-decoder component 510 (e.g., BL decoder) that can each respectively decode inputs/outputs during various operations (e.g., programming, reading, verifying, erasing) that can be performed on the memory cells 106. The X-decoder component 508 and Y-decoder component 510 can each receive address bus information from a host processor (e.g., as illustrated in FIG. 7) and/or system controller (not shown) or the like, and can utilize such information to facilitate accessing or selecting the desired memory cell(s) 106 (e.g., memory location(s)) associated with the command. The memory cells 106 can be formed in M rows and N columns. A common WL can be attached to the gate of each memory cell 106 in a row, such as word-lines WL0, WL1, WL2, through WLM. A common BL can be attached to each cell 106 in a column, such as bit-lines BL0, BL1, through BLN. A WL can contain, for example, 1024 elements forming multiple words and a sector can include, for example, 512 WLs to provide at least 512 k elements of memory. In accordance with an aspect of the disclosed subject matter, respective voltages can be applied to one or more cells 106 through the WLs and BLs to facilitate performing operations, such as program, read, erase, and the like.

Referring to FIG. 7, depicted is a block diagram of a system 700 that can employ intelligence to facilitate deterministic-based programming associated with a memory in accordance with an embodiment of the disclosed subject matter. System 700 can include a memory component 102 that can be comprised of a non-volatile memory (e.g., multi-bit flash memory) and/or volatile memory (e.g., SRAM). The memory component 102 can include a memory array 104 that can be comprised of a plurality of memory cells 106 (not shown), where, for each memory cell 106, one or more bits of data can be stored (e.g., memory cell can comprise one or more memory elements, wherein each memory element can store one or more bits of data), and from which stored data can be read. The memory component 102 also can include an optimized program component 108 that can employ deterministic-based programming (e.g., deterministic programming, hybrid deterministic/moving-reference programming) to facilitate efficient programming associated with the memory component 102. It is to be appreciated that the memory component 102, memory array 104, memory cells 106, and optimized program component 108, each can be the same or similar as respective components, and/or can contain the same or similar functionality as respective components, as more fully described herein, for example, with regard to system 100, system 400, memory device 500, and the portion of a memory component 600.

The system 700 can further include a processor component 702 that can be associated with the memory component 102 and other components via a bus. In accordance with an embodiment of the disclosed subject matter, the processor component 702 can be a typical applications processor that can manage communications and run applications. For example, the processor component 702 can be a processor that can be utilized by a computer, mobile handset, personal data assistant (PDA), or other electronic device. The processor component 702 can generate commands, including read, write, and/or erase commands, in order to facilitate reading data from, writing data to, and/or erasing data from the memory component 102.

The system 700 also can include an intelligent component 704 that can be associated with the memory component 102, including the optimized program component 108, and/or other components associated with system 700 to facilitate analyzing data, such as current and/or historical information related to operations (e.g., read, verify) performed in the memory component 102, and, based in part on such information, can make an inference(s) and/or a determination(s) regarding, for example, a desirable (e.g., optimized) division of selected memory elements for programming into a desirable (e.g., optimized) number of subgroups of memory elements, respective program parameters to be utilized with regard to respective subgroups of memory elements, a desired (e.g., optimized) number of program pulses to be employed during a program operation, a desired (e.g. optimized) number of program verify levels to be employed during a program operation, based at least in part on predefined deterministic program criteria.

For instance, based in part on current and/or historical information related to operations, such as program operations, the intelligent component 704 can infer that, for a group of memory elements selected for programming, the number of subgroups of memory elements to be employed for a program operation is to be modified to a different number of subgroups to facilitate more efficient programming in the memory component 102 based at least in part on predefined deterministic program criteria; the division of memory elements into subgroups for memory elements selected for programming during a program operation is to be modified to a disparate division of memory elements into subgroups to facilitate more efficient programming in the memory component 102 based at least in part on predefined deterministic program criteria; and/or desired (e.g., optimized) respective program parameters (e.g., drain voltage, gate voltage, pulse width) to be employed with regard to respective subgroups of memory elements during a program operation. The intelligent component 704 can communicate an inference(s) and/or determination(s) to the optimized program component 108. Based at least in part on the inference(s) and/or determination(s) received by the optimized program component 108, the optimized program component 108 can facilitate modifying a function(s) and/or parameter(s) associated with programming data to the memory component 102. For example, the optimized program component 108 can facilitate modifying the number of subgroups of memory elements employed during a program operation, a division of memory elements into subgroups, and/or program parameters to be employed during a program operation.

It is to be understood that the intelligent component 704 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

System 700 also can include a presentation component 706, which can be connected with the processor component 702. The presentation component 706 that provides various types of user interfaces to facilitate interaction between a user and any component coupled to the processor component 702. As depicted, the presentation component 706 is a separate entity that can be utilized with the processor component 702 and associated components. However, it is to be appreciated that the presentation component 706 and/or similar view components can be incorporated into the processor component 702 and/or a stand-alone unit. The presentation component 706 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the processor component 702.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and enhanced graphics adapter (EGA)) with limited graphic support, and/or low bandwidth communication channels.

In accordance with one embodiment of the disclosed subject matter, the memory component 102, including the memory array 104, memory cells 106, the optimized program component 108, and/or other components, can be situated or implemented on a single integrated-circuit chip. In accordance with another embodiment, the memory component 102, including the memory array 104, the memory cells 106, the optimized program component 108, and/or other components, can be implemented on an application-specific integrated-circuit (ASIC) chip. In yet another embodiment, the memory component 102 including the memory array 104, the memory cells 106, the optimized program component 108, and/or other components, can be situated or implemented on multiple dies or chips.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

FIGS. 8-11 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 8:
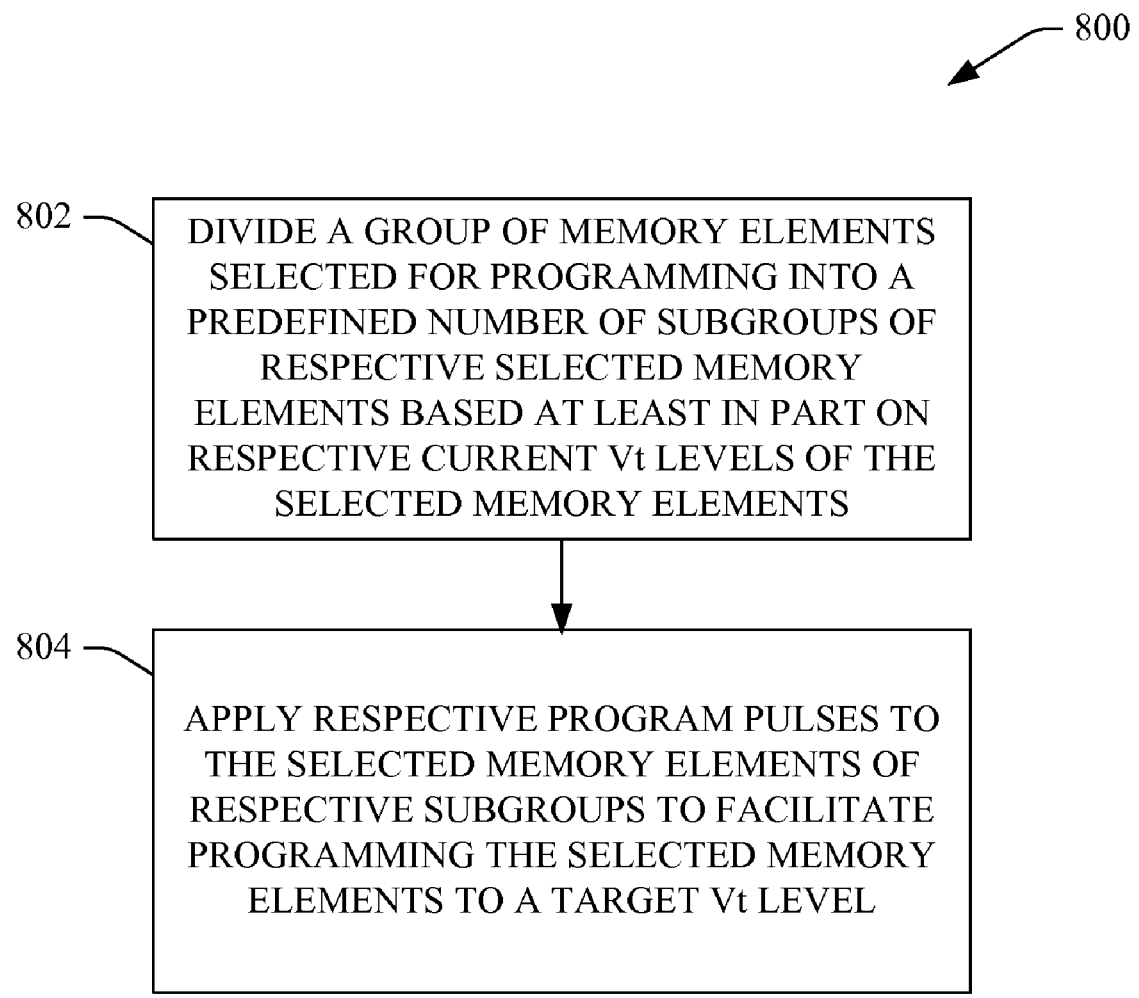
FIG. 8 illustrates a methodology that can employ deterministic programming to facilitate programming data in a memory in accordance with an aspect of the disclosed subject matter.

Referring to FIG. 8, illustrated is a methodology 800 that can employ deterministic programming to facilitate programming data in a memory in accordance with an aspect of the disclosed subject matter. At 802, a group of memory elements selected for programming can be divided into a predefined number of subgroups of respective memory elements based at least in part on respective current Vt levels of the selected memory elements. In one aspect, an optimized program component 108 can facilitate selecting a group of memory elements for programming to a desired Vt level that can correspond to a desired data state. The selected memory elements initially can be in an intrinsic or unverified state. The optimized program component 108 can determine respective current Vt levels of the selected memory elements, for example, by performing a read (e.g., a single read) on each memory element. The optimized program component 108 can divide the group of memory elements into a predefined number of subgroups based at least in part on respective current Vt levels of the memory elements (e.g., memory elements that have Vt levels that are lower than a predetermined threshold voltage level can be placed in a subgroup; and memory elements that have Vt levels that are higher than a predetermined threshold voltage level can be placed in a disparate subgroup(s). The number of subgroups and the division of the memory elements into the subgroups (e.g., based in part on respective threshold voltage levels respectively associated with each subgroup) can be determined based at least in part predefined deterministic program criteria.

At 804, respective program pulses can be applied to the selected memory elements in respective subgroups to facilitate programming the selected memory elements to a desired target Vt level. In an aspect, program parameters, such as drain voltage, gate voltage, and program pulse width, can be set, respectively, for each subgroup of selected memory elements to facilitate setting the respective program pulses for each subgroup. The program pulse applied to a subgroup of selected memory elements can be different than, or the same as, the program pulse applied to another subgroup depending in part on the respective current Vt levels of the memory elements of the respective subgroups and the predefined deterministic program criteria. The memory elements can be verified after the respective program pulses are applied to the subgroups of memory elements to determine whether any of the memory elements are verified as a pass for the target Vt level, where the verification can involve determining respective current Vt levels of the memory elements after the respective program pulses are applied to the subgroups of memory elements.

Programming can be complete for the memory elements that are verified as a pass to the target Vt level. Memory elements that are not verified as a pass to the target Vt level can be selected and divided into respective subgroups based at least in part on respective current Vt levels of those memory elements, and another set of respective program pulses can be applied to selected memory elements of respective subgroups of selected memory elements to facilitate programming the remaining memory elements to the target Vt level. The programming can continue until all of the memory elements selected for programming are verified as a pass to the desired target Vt level that corresponds to a desired data state. At this point, methodology 800 can end.

Figure 9:
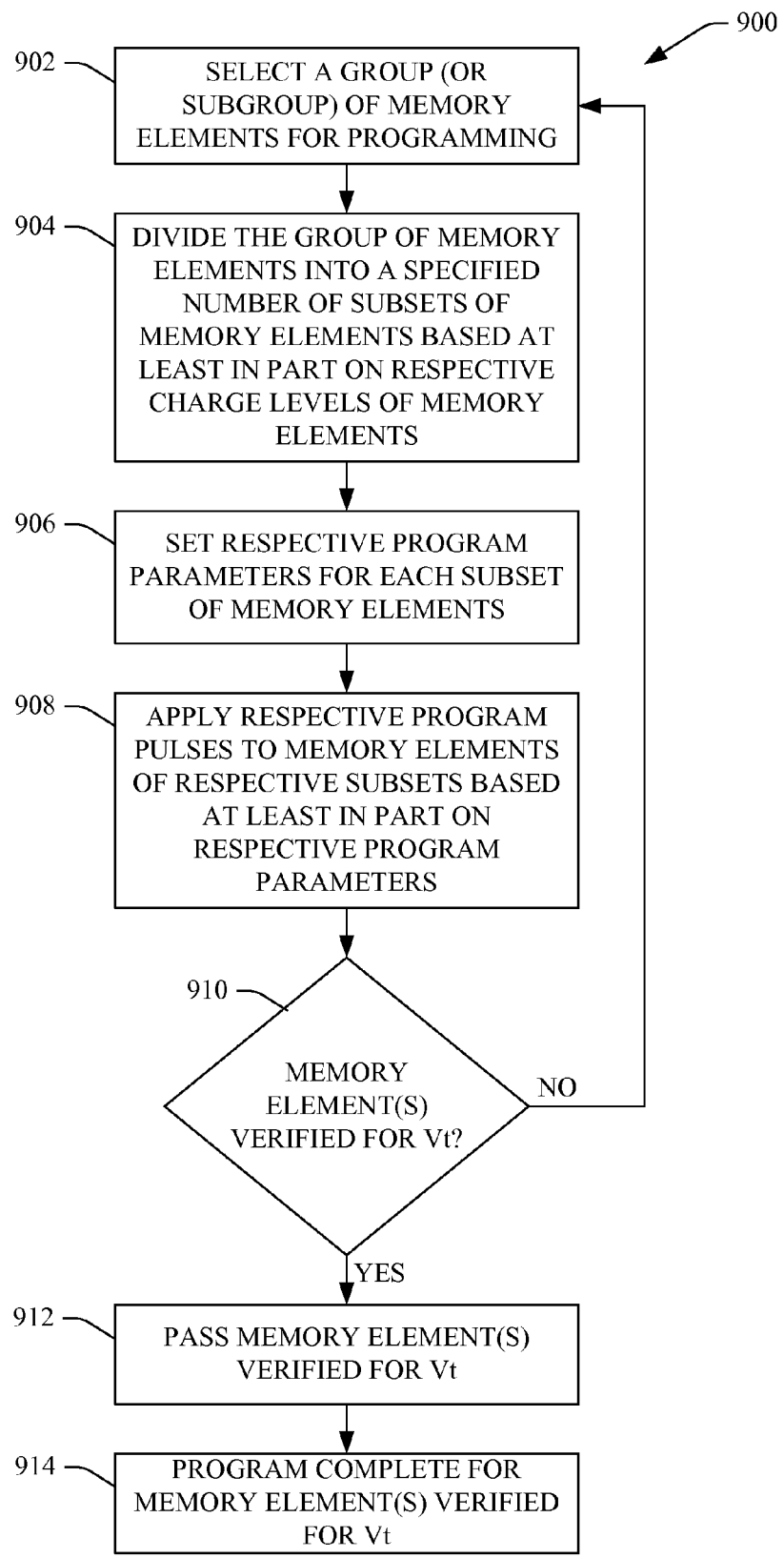
FIG. 9 depicts another methodology that can employ deterministic programming to facilitate optimizing programming of memory elements in the memory in accordance with an aspect of the disclosed subject matter.

Turning to FIG. 9, illustrated is another methodology 900 that can employ deterministic programming to facilitate optimizing programming of memory elements in the memory in accordance with an aspect of the disclosed subject matter. At 902, a group of memory elements can be selected for programming. The memory elements can be contained in respective memory cells 106, where each memory cell 106 can comprise one or more memory elements. Each memory element can be utilized to store one or more bits of data. The memory elements can be selected for programming based at least in part on a program command received by the memory component 102. The memory elements each can be programmed to respective data states to facilitate storing data in the memory (e.g., memory array 104 in memory component 102).

At 904, the group of memory elements can be divided into a specified number of subsets of memory elements based at least in part on respective charge levels of the memory elements (e.g., respective Vt levels stored in the memory elements). The number of subsets and the division of the memory elements into the subsets can be determined based at least in part predefined deterministic program criteria. Initially, the memory elements can be in an intrinsic or unverified state. In an aspect, the optimized program component 108 can read each memory element (e.g., perform a single read measurement) to facilitate determining respective current Vt levels of each of the memory elements to facilitate determining which memory elements are to be included in a particular subset.

For example, the group of memory elements can be divided into four subsets where memory elements having lower Vt levels can be placed in subset 1 and memory elements having higher Vt levels can be placed in subset 4. Subset 2 can include memory elements having Vt levels that are higher than the Vt levels of memory elements of subset 1, but lower than the Vt levels of memory elements in subset 3; and subset 3 can include memory elements that have Vt levels that are lower than the Vt levels of memory elements in subset 4, but higher than the Vt levels of the memory elements in subset 2.

At 906, respective program parameters can be set for each subset of memory elements. In an aspect, the optimized program component 108 can set respective program parameters, including respective drain voltages, respective gate voltages, respective program pulse widths, that can be respectively applied to memory elements of each subset. The program parameters set and applied for memory elements in one subgroup can be different than, or the same as, the program parameters set and applied to memory elements of another subset.

At 908, respective program pulses can be applied to each selected memory element, where a respective program pulse can be based at least in part on the respective program parameters of each subset. For example, if there are four subsets of memory elements, a program pulse 1, which can be based at least in part on a first set of program parameters, can be applied to memory elements in subset 1; a program pulse 2, which can be based at least in part on a second set of program parameters, can be applied to memory elements in subset 2; a program pulse 3, which can be based at least in part on a third set of program parameters, can be applied to memory elements in subset 3; and a program pulse 1, which can be based at least in part on a first set of program parameters, can be applied to memory elements in subset 1.

At 910, a determination can be made regarding whether any memory elements are verified as a pass to a target Vt level. In an aspect, the optimized program component 108 can read each memory element after respective program pulses have been applied to facilitate determining respective current Vt levels of each memory element, and a memory element(s) that has a Vt level that is at or above the target Vt level can be verified as a pass to the target Vt level, and programming can be complete for the verified memory element(s). If, at 910, it is determined that a memory element(s) is verified as a pass to the target Vt, at 912, the memory element(s) can be passed with regard to the target Vt level. At 914, programming can be complete for any memory elements that are verified as a pass for the target Vt level, and such memory elements will not receive any more program pulses during the program operation.

If, at 910, it is determined that one or more memory elements are not verified as a pass for the target Vt level, methodology 900 can return to reference numeral 902, where memory elements that are not verified as a pass to the target Vt level can be selected to be in the subgroup of memory elements. Methodology 900 can proceed from that point, where, for instance, the subgroup of memory elements (e.g., unverified memory elements) can be divided into a specified number of subsets based at least in part on respective current Vt levels; respective program parameters can be set for each subset; a respective program pulse(s) can be applied to each selected memory element of a respective subset; and verification of each selected memory element can be performed to facilitate determining whether a memory element(s) is verified as a pass to the target Vt level. Methodology 900 can continue until all memory elements are verified as a pass to the target Vt level. At this point, methodology 900 can end.

Figure 10:
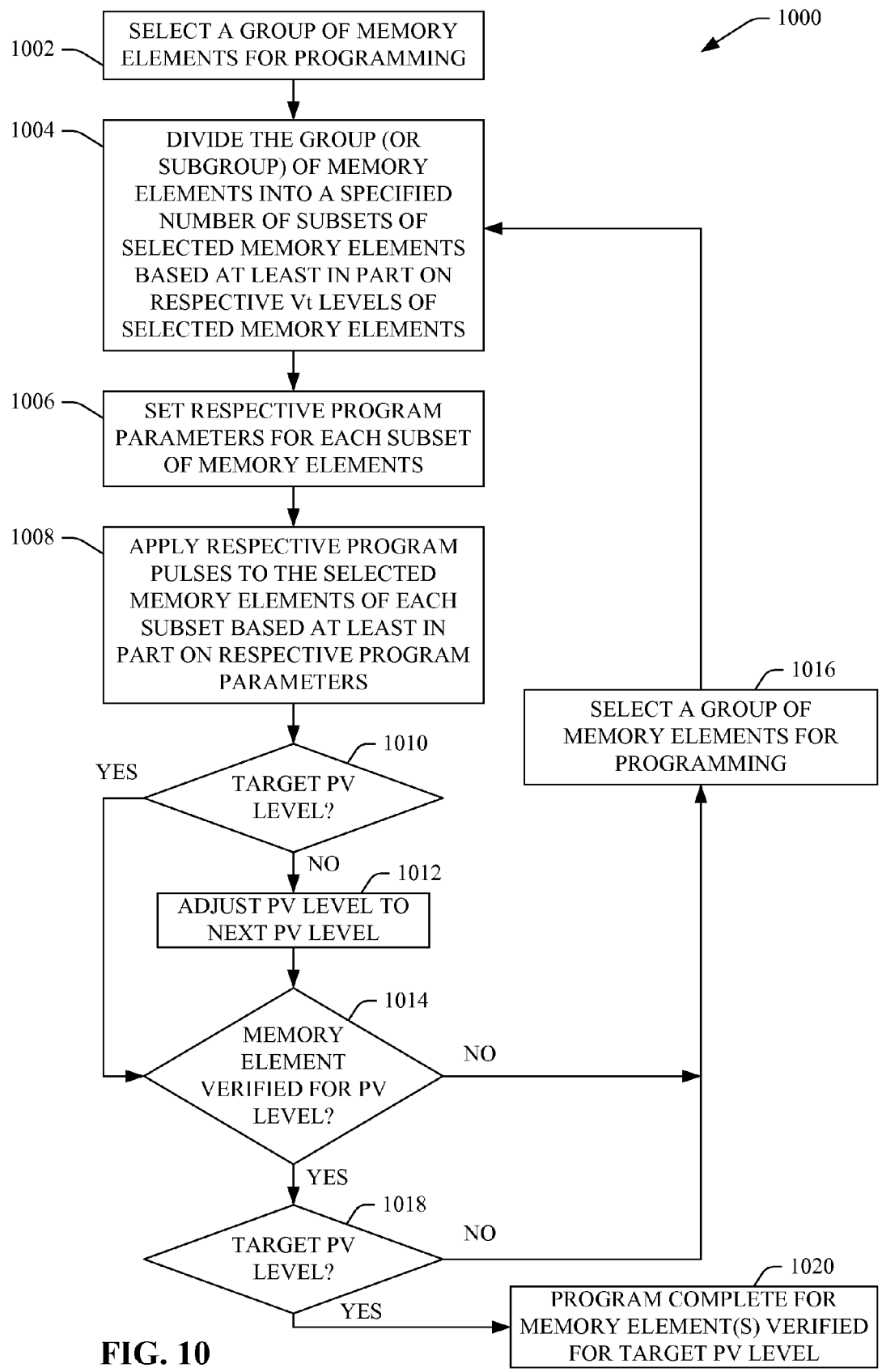
FIG. 10 illustrates a methodology that can employ hybrid deterministic/moving-reference programming to facilitate optimizing programming of memory elements in the memory in accordance with an embodiment of the disclosed subject matter.

Referring to FIG. 10, illustrated is a methodology 1000 that can employ hybrid deterministic/moving-reference programming to facilitate optimizing programming of memory elements in the memory in accordance with an embodiment of the disclosed subject matter. At 1002, a group of memory elements can be selected for programming. The memory elements can be contained in respective memory cells 106, where each memory cell 106 can comprise one or more memory elements. Each memory element can be utilized to store one or more bits of data. The memory elements can be selected for programming based at least in part on a program command received by the memory component 102. The memory elements each can be programmed to respective data states to facilitate storing data in the memory (e.g., memory array 104 in memory component 102).

At 1004, the group of memory elements can be divided into a specified number of subsets of memory elements based at least in part on respective charge levels of the memory elements (e.g., respective Vt levels stored in the memory elements). The number of subsets and the division of the memory elements into the subsets can be determined based at least in part predefined deterministic program criteria. Initially, the memory elements can be in an intrinsic or unverified state. In an aspect, the optimized program component 108 can read each memory element (e.g., perform a single read measurement) to facilitate determining respective current Vt levels of each of the memory elements to facilitate determining which memory elements are to be included in a particular subset.

For example, the group of memory elements can be divided into four subsets where memory elements having lower Vt levels can be placed in subset 1 and memory elements having higher Vt levels can be placed in subset 4. Subset 2 can include memory elements having Vt levels that are higher than the Vt levels of memory elements of subset 1, but lower than the Vt levels of memory elements in subset 3; and subset 3 can include memory elements that have Vt levels that are lower than the Vt levels of memory elements in subset 4, but higher than the Vt levels of the memory elements in subset 2.

At 1006, respective program parameters can be set for each subset of memory elements. In an aspect, the optimized program component 108 can set respective program parameters, including respective drain voltages, respective gate voltages, respective program pulse widths, that can be respectively applied to memory elements of each subset. The program parameters can be respectively set based at least in part on the respective subsets, the particular program verify level associated with the program pulse (e.g., intermediate program verify level, or target program verify level that corresponds to the target Vt level), and the predefined deterministic program criteria. In an aspect, the program parameters can be respectively set for the respective program pulses so that, after the respective program pulses are applied to the memory elements of the respective subsets, all or substantially all memory elements of each of the subsets can be verified as a pass to the desired program verify level (e.g., intermediate PV level, target PV level). In another aspect, the program parameters set and applied for memory elements in one subgroup can be different than, or the same as, the program parameters set and applied to memory elements of another subset.

At 1008, respective program pulses can be applied to each selected memory element, where a respective program pulse can be based at least in part on the respective program parameters of each subset. For example, if there are four subsets of memory elements, a program pulse 1, which can be based at least in part on a first set of program parameters, can be applied to memory elements in subset 1; a program pulse 2, which can be based at least in part on a second set of program parameters, can be applied to memory elements in subset 2; a program pulse 3, which can be based at least in part on a third set of program parameters, can be applied to memory elements in subset 3; and a program pulse 1, which can be based at least in part on a first set of program parameters, can be applied to memory elements in subset 1.

At 1010, a determination can be made regarding whether the current program verify (PV) level (or current Vt level) is the target PV level (or target Vt level). If, at 1010, it is determined that the current PV level (or current Vt level) is the target PV level (or target Vt level), methodology 1000 can proceed to reference numeral 1014 and can proceed from that point. If, at 1010, it is determined that the current PV level (or current Vt level) is not the target PV level (or target Vt level) (e.g., the current PV level (or current Vt level) is an intermediate PV level (or intermediate Vt level)), at 1012, the current PV level (or Vt level) can be adjusted to a next PV level (or next Vt level). For instance, the next PV level (or next Vt level) can be a higher voltage level than the previous PV level (or previous Vt level). At this point, methodology 1000 can proceed to reference numeral 1014.

At 1014, a determination can be made regarding whether a memory element(s) is verified as a pass for the applicable PV level (or applicable Vt level), which can be the next PV level (or next Vt level), as adjusted at reference numeral 1012, and/or a target PV level (or target Vt level), if the target PV level (or target Vt level) is already reached, as determined at reference numeral 1010, or is reached due to the adjustment of the PV level (or target Vt level) at reference numeral 1012.

If, at 1014, it is determined that a memory element(s) is not verified as a pass to the applicable PV level (or Vt level) (e.g., a memory element(s) is below the applicable PV level), at 1016, a subgroup of memory elements can be selected for further programming. For instance, the selected memory elements that are not verified as a pass to the applicable PV level (or Vt level) can be selected for a subgroup of memory elements that can be further programmed. At this point, the methodology 1000 can return to reference numeral 1004, and methodology 1000 can proceed to divide the subgroup of memory elements into a specified number of subsets based at least in part on respective current Vt levels of the memory elements, and can proceed from that point.

If, at 1014, it is determined that a memory element(s) is verified as a pass to the applicable PV level (or Vt level), at 1018, a determination can be made regarding whether the applicable PV level (or Vt level) is a target PV level (or target Vt level). If, at 1018, it is determined that the applicable PV level (or Vt level) is the target PV level (or target Vt level), at 1020, programming of the memory element(s) that is verified as a pass to the target PV level (or target Vt level) can be complete.

If, at 1018, it is determined that the applicable PV level (or Vt level) is not the target PV level (or target Vt level), methodology 1000 can return to reference numeral 1014, where after respective next program pulses are applied to the subgroup of selected memory elements in respective subsets (but not a memory element(s) that is verified as a pass to the applicable PV level (or Vt level) during the previous iteration), a determination can be made regarding whether any memory element(s) is verified as a pass for the applicable PV level (or Vt level). Methodology 1000 can proceed from that point. The methodology 1000 can continue until the group of memory elements are all verified as a pass to the desired target PV level (or desired target Vt level). At this point, methodology 1000 can end.

Figure 11:
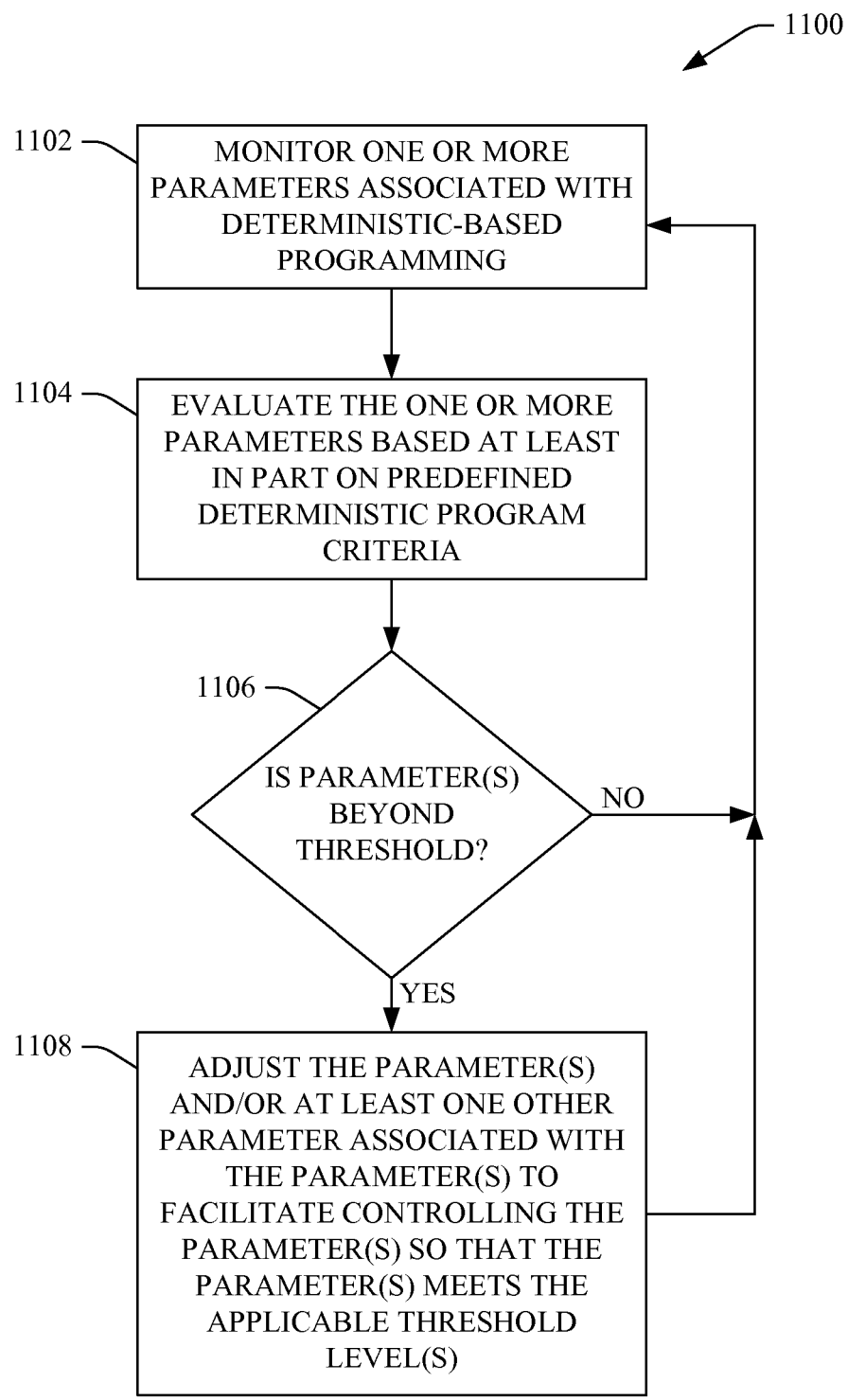
FIG. 11 depicts a methodology that can facilitate fine tuning deterministic-based programming to facilitate optimizing programming of memory elements in the memory in accordance with an embodiment of the disclosed subject matter.

Turning to FIG. 11, depicted is a methodology 1100 that can facilitate fine tuning deterministic-based programming to facilitate optimizing programming of memory elements in the memory in accordance with an embodiment of the disclosed subject matter. At 1102, one or more parameters (e.g., program parameters) associated with deterministic-based programming can be monitored. For instance, one or more parameters can be monitored, where the parameters can include, for example, drain voltage, gate voltage, program pulse width, number of subsets of memory elements into which memory elements are divided during a program operation, threshold voltage level(s) employed with regard to a subset of memory elements, target Vt level, number of program verify levels (or corresponding intermediate Vt levels and target Vt level) employed for hybrid deterministic/moving-reference programming during a program operation, programming speed, number of program pulses applied during a program operation, etc.

At 1104, the one or more parameters can be evaluated based at least in part on predefined deterministic program criteria. In an aspect, the one or more parameters can be measured, respectively, and the respective measured value(s) of the parameter(s) can be evaluated, based at least in part on the predefined deterministic program criteria, to facilitate determining whether the measured value(s) of the parameter(s) meets an applicable threshold level or value related to that parameter(s).

At 1106, a determination can be made regarding whether a parameter(s) is below an applicable minimum threshold level or above an applicable maximum threshold level related to the parameter(s). In an aspect, the optimized program component 108 can facilitate determining whether a parameter is beyond an applicable threshold level (e.g., below an applicable minimum threshold level or above an applicable maximum threshold level).

If, at 1106, it is determined that no parameter is beyond an applicable threshold level, methodology 1100 can return to reference numeral 1102, where methodology 1100 can continue to monitor the one or more parameters, and methodology 1100 can proceed from that point. If, at 1106, it is determined that a parameter is beyond an applicable threshold level, at 1108, the parameter and/or another parameter(s) that is associated with the parameter can be adjusted to facilitate controlling the parameter so that the parameter meets the applicable threshold level(s). In an aspect, the optimized program component 108 can facilitate adjusting a parameter that is beyond an applicable threshold level and/or another parameter(s) associated with the parameter to facilitate controlling the parameter so that the parameter meets the applicable threshold level(s) based at least in part on the predefined deterministic program criteria.

For example, the optimized program component 108 can determine that the program pulse applied to a particular subset of memory elements is below an applicable threshold voltage level, due in part to the memory elements in the particular subset not reaching expected or desired respective charge levels after the program pulse is applied. The optimized program component 108 can determine a respective drain voltage level, gate voltage level, and/or program pulse width that can result in the program pulse programming the memory elements in the particular subset to desired or expected respective charge levels. The optimized program component 108 can facilitate adjusting the drain voltage level, gate voltage level, and/or program pulse width for the program pulse to be applied to the particular subset of memory elements (e.g., to be applied during a subsequent programming operation) so that the program pulse meets the applicable threshold voltage level.

At this point, methodology 1100 can return to reference numeral 1102, where methodology 1100 can continue to monitor the one or more parameters, and methodology 1100 can proceed from that point.

Figure 12:
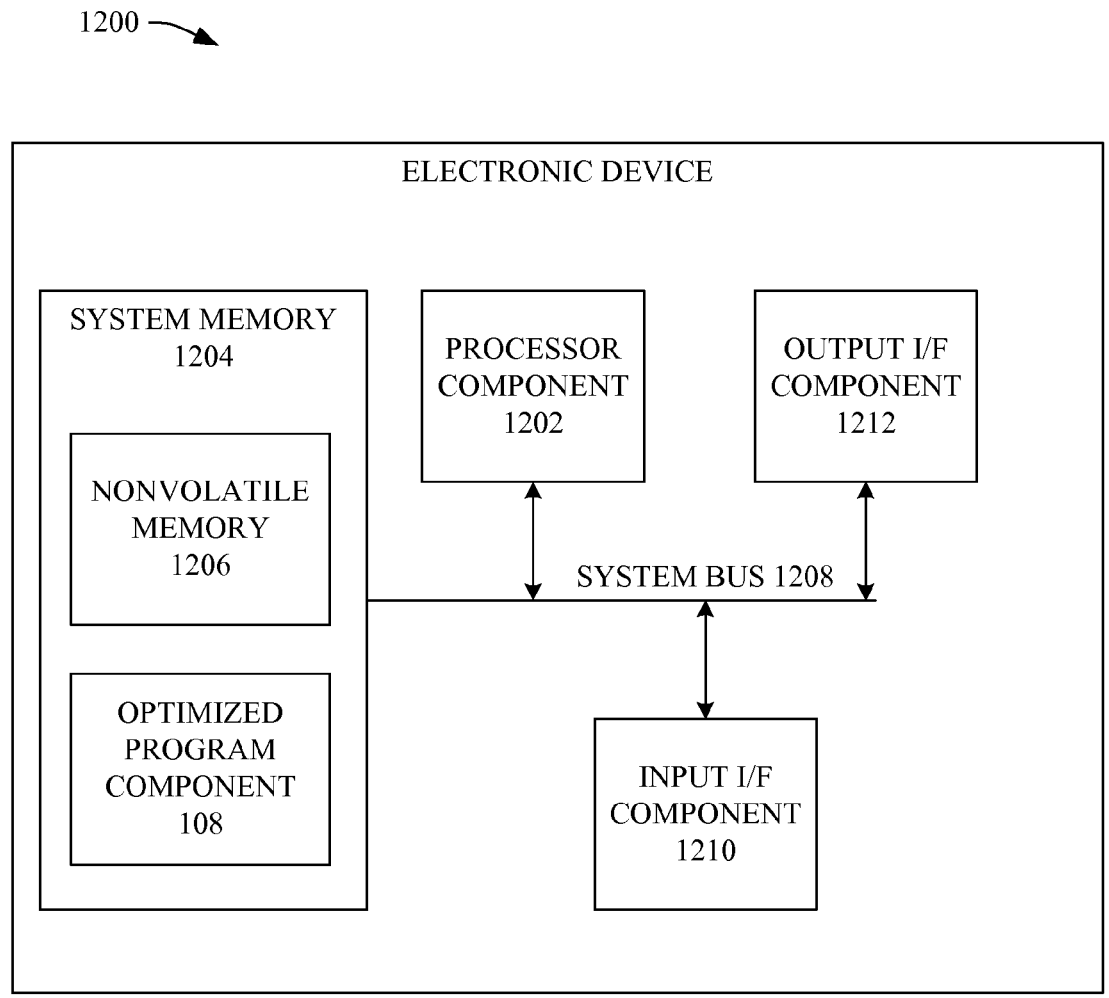
FIG. 12 is a block diagram of an exemplary, non-limiting electronic device that can employ a memory.

Referring to FIG. 12, illustrated is a block diagram of an exemplary, non-limiting electronic device 1200 that can comprise and/or incorporate system 100, system 400, memory device 500, portion of memory component 102 (e.g., as illustrated in FIG. 6), and/or system 700, or a respective portion(s) thereof, and/or implement methodology 800, methodology 900, methodology 1000, and/or methodology 1100, or respective portions, aspects, or embodiments thereof. The electronic device 1200 can include, but is not limited to, a computer, a laptop computer, network equipment (e.g., routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), a set-top box, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like.

Components of the electronic device 1200 can include, but are not limited to, a processor component 1202 (e.g., which can be and/or can include the same or similar functionality as processor component 702, as depicted in FIG. 7 and described herein), a system memory 1204, which can contain a nonvolatile memory 1206, and a system bus 1208 that can couple various system components including the system memory 1204 to the processor component 1202. In one aspect, the system memory 1204 can be and/or can comprise the same or similar functionality as respective components (e.g., memory component 102, including the optimized program component 108) as more fully described herein, for example, with regard to system 100, system 400, memory device 500, system 700, etc. For instance, the system memory 1204 can include the optimized program component 108. In another aspect, the system bus 1208 can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

Electronic device 1200 can typically include a variety of computer readable media. Computer readable media can be any available media that can be accessed by the electronic device 1200. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 1206 (e.g., flash memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1200. Communication media typically embodies computer readable instructions, data structures, program modules or other data in a modulated data signal such as a carrier wave or other transport mechanism and includes any information delivery media.

The system memory 1204 can include computer storage media in the form of volatile (e.g., SRAM) and/or nonvolatile memory 1206 (e.g. flash memory), where the nonvolatile memory 1206 can be removable media or non-removable media. A basic input/output system (BIOS), containing the basic routines that can facilitate transferring information between elements within electronic device 1200, such as during start-up, can be stored in the system memory 1204. The system memory 1204 typically also can contain data and/or program modules that can be accessible to and/or presently be operated on by the processor component 1202. By way of example, and not limitation, the system memory 1204 can also include an operating system(s), application programs, other program modules, and program data.

The nonvolatile memory 1206 can be removable or non-removable. For example, the nonvolatile memory 1206 can be in the form of a removable memory card or a USB flash drive. In accordance with one aspect, the nonvolatile memory 1206 can include flash memory (e.g., single-bit flash memory, multi-bit flash memory), ROM, PROM, EPROM, EEPROM, PCM, or NVRAM (e.g., FeRAM), or a combination thereof, for example. Further, a flash memory can comprise NOR flash memory and/or NAND flash memory.

A user can enter commands and information into the electronic device 1200 through input devices (not shown) such as a keypad, microphone, tablet, or touch screen although other input devices can also be utilized. These and other input devices can be connected to the processor component 1202 through input interface component 1210 that can be connected to the system bus 1208. Other interface and bus structures, such as a parallel port, game port or a universal serial bus (USB) can also be utilized. A graphics subsystem (not shown) can also be connected to the system bus 1208. A display device (not shown) can be also connected to the system bus 1208 via an interface, such as output interface component 1212, which can in turn communicate with video memory. In addition to a display, the electronic device 1200 can also include other peripheral output devices such as speakers (not shown), which can be connected through output interface component 1212.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

As utilized herein, terms "component," "system," "interface," and the like, can refer to a computer-related entity, either hardware, software (e.g. in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein can encompass a computer program accessible from any computer-readable device, carrier, or media. For example, computer readable media can include, but is not limited to, magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications can be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates deterministic-based programming in a memory component, comprising:
the memory component comprising a plurality of memory elements that facilitate data storage; and
an optimized program component that facilitates division of a group of selected memory elements into a specified number of subsets of selected memory elements and application of respective program pulses to the selected memory elements respectively associated with each subset of selected memory elements, based at least in part on predefined deterministic program criteria, to facilitate programming the selected memory elements to a target threshold voltage level that corresponds to a target data state.

2. The system of claim 1, wherein the selected memory elements are placed in the respective subsets based at least in part on respective current threshold voltage levels of the selected memory elements.

3. The system of claim 1, the optimized program component sets respective program parameters for the respective subsets of selected memory components, wherein the respective program parameters facilitate generation of respective program pulses that are applied to the selected memory elements in the respective subsets.

4. The system of claim 3, the optimized program component applies respective program pulses to the selected memory elements in the respective subsets, and reads the respective voltage levels of the selected memory elements to facilitate verification of the selected memory elements as a pass for the target threshold voltage level.

5. The system of claim 4, the optimized program component verifies one or more selected memory elements as a pass for the target threshold voltage level when the one or more selected memory elements respectively each has a threshold voltage level that is at or above the target threshold voltage level.

6. The system of claim 5, the optimized program component selects the selected memory elements that are not verified as a pass to the target threshold level, groups the unverified memory elements, and divides the group of unverified memory elements into a predefined number of subsets of unverified memory elements based at least in part on respective current threshold voltage levels of the unverified memory elements.

7. The system of claim 6, the optimized program component sets respective program parameters for each subset of unverified memory elements, and applies respective program pulses to the unverified memory elements of the respective subsets of unverified memory elements to facilitate programming the unverified memory elements to the target threshold voltage level, wherein respective program pulses are based at least in part on the respective program parameters.

8. The system of claim 7, the optimized program component determines whether one or more unverified memory elements are verified as a pass to the target threshold voltage level, and programming is complete with regard to any previously unverified memory element that is determined to be verified as a pass to the target threshold level.

9. The system of claim 8, the optimized program component continues to divide remaining unverified memory elements into a desired number of subsets of unverified memory elements and to apply respective program pulses to unverified memory elements of respective subsets of unverified memory elements until all of the memory elements selected for programming are programmed to the target threshold voltage level.

10. The system of claim 1, the optimized program component employs hybrid deterministic/moving-reference programming to facilitate programming the selected memory elements to the target threshold voltage level.

11. The system of claim 10, the optimized program component sets respective program parameters for the respective subsets of selected memory components, wherein the respective program parameters facilitate generation of respective program pulses that are applied to the selected memory elements in the respective subsets to facilitate programming the selected memory elements to at least an applicable threshold voltage level.

12. The system of claim 11, the optimized program component determines whether the applicable threshold voltage level is the target threshold voltage level.

13. The system of claim 12, if it is determined that the applicable threshold voltage level is the target threshold voltage level, the optimized program component determines whether one or more of the selected memory elements are verified as a pass to the target threshold voltage level, and verifies one or more memory elements as a pass to the target threshold voltage level when the one or more memory elements respectively each has a threshold voltage level that is at or above the target threshold voltage level, wherein programming of the one or more verified memory elements is complete.

14. The system of claim 13, the optimized program component selects the selected memory elements that are not verified as a pass to the target threshold level, groups the unverified memory elements, and divides the group of unverified memory elements into a predefined number of subsets of unverified memory elements based at least in part on respective current threshold voltage levels of the unverified memory elements.

15. The system of claim 14, the optimized program component sets respective program parameters for each subset of unverified memory elements, and applies respective program pulses to the unverified memory elements of the respective subsets of unverified memory elements to facilitate programming the unverified memory elements to the target threshold voltage level, wherein respective program pulses are based at least in part on the respective program parameters.

16. The system of claim 15, the optimized program component determines whether one or more unverified memory elements are verified as a pass to the target threshold voltage level, and programming is complete with regard to any previously unverified memory element that is determined to be verified as a pass to the target threshold level.

17. The system of claim 16, the optimized program component continues to divide remaining unverified memory elements into a desired number of subsets of unverified memory elements and to apply respective program pulses to unverified memory elements of respective subsets of unverified memory elements until all of the memory elements selected for programming are verified as a pass to the target threshold voltage level.

18. The system of claim 12, if it is determined that the applicable threshold voltage level is not the target threshold voltage level, the optimized program component adjusts the applicable threshold voltage level to at least one other applicable target threshold voltage level, determines whether one or more of the selected memory elements are verified as a pass to the at least one other threshold voltage level, and verifies one or more memory elements as a pass to the at least one other threshold voltage level when the one or more memory elements respectively each has a threshold voltage level that is at or above the at least one other threshold voltage level.

19. The system of claim 18, the optimized program component selects the selected memory elements that are not verified as a pass to the at least one other threshold level, groups the unverified memory elements, and divides the group of unverified memory elements into a predefined number of subsets of unverified memory elements based at least in part on respective current threshold voltage levels of the unverified memory elements.

20. The system of claim 19, the optimized program component sets respective program parameters for each subset of unverified memory elements based at least in part on the respective subsets of unverified memory elements and the at least one other threshold voltage level, and applies respective program pulses to the unverified memory elements of the respective subsets of unverified memory elements to facilitate programming the unverified memory elements to the target threshold voltage level, wherein respective program pulses are based at least in part on the respective program parameters.

21. The system of claim 20, the optimized program component determines whether the at least one other threshold voltage level is the target threshold voltage level.

22. The system of claim 21, the optimized program component continues to adjust the at least one other threshold voltage level between application of respective program pulses until the target threshold voltage level is reached; and continues to divide remaining unverified memory elements into a desired number of subsets of unverified memory elements and to apply respective program pulses to unverified memory elements of respective subsets of unverified memory elements until all of the memory elements selected for programming are verified as a pass to the target threshold voltage level.

23. The system of claim 1, further comprising:
an evaluator component that monitors, measures, and evaluates at least one parameter associated with programming in the memory component, and determines whether the at least one parameter at least one of exceeds an applicable predetermined maximum threshold level or is below an applicable predetermined minimum threshold level respectively related the at least one parameter, based at least in part on predefined deterministic program criteria, to facilitate fine tuning programming data in the memory.

24. The system of claim 23, the evaluator component modifies the at least one parameter or at least one other parameter associated with the at least one parameter when the evaluator component determines that the at least one parameter at least one of exceeds the applicable predetermined maximum threshold level or is below the applicable predetermined minimum threshold level, wherein the at least one parameter, when modified, is at or lower than the applicable predetermined maximum threshold level and at or above the applicable predetermined minimum threshold level.

25. The system of claim 1, the predefined deterministic program criteria relates to at least one of type of memory cell, number of available data levels for each memory element in the memory cell, number of memory elements in the memory cell, respective threshold voltage level for a particular data level, or a threshold voltage distribution of a memory element.

26. An electronic device comprising the system of claim 1.

27. The electronic device of claim 26, the electronic device is one of a computer, a cellular phone, a digital phone, a video device, a smart card, a personal digital assistant, a television, an electronic game, a digital camera, an electronic organizer, an audio player, an audio recorder, an electronic device associated with digital rights management, a Personal Computer Memory Card International Association (PCMCIA) card, a trusted platform module (TPM), an electronic control unit associated with a motor vehicle, a global positioning satellite (GPS) device, an electronic device associated with an airplane, an electronic device associated with an industrial control system, a Hardware Security Module (HSM), a set-top box, a secure memory device with computational capabilities, or an electronic device with at least one tamper-resistant chip.

28. A method for utilizing deterministic-based programming to program data in a memory, comprising:
dividing a group of memory elements selected for programming into a predefined number of subgroups of respective memory elements based at least in part on respective current voltage levels of the selected memory elements; and
applying respective program pulses to the selected memory elements in the respective subgroups to facilitate programming the selected memory elements to a target threshold voltage level that corresponds to a target data state.

29. The method of claim 28, further comprising:
selecting a group of memory elements selected for programming;
utilizing predefined deterministic program criteria to facilitate dividing the group of selected memory elements in the predefined number of subgroups of selected memory elements;
setting respective program parameters for each respective subgroup of selected memory elements to facilitate applying respective program pulses to the selected memory elements in the respective subgroups; and
determining whether one or more selected memory elements are verified as a pass for the target threshold voltage level.

30. The method of claim 29, further comprising:
verifying as a pass one or more selected memory elements for the target threshold voltage level when the one or more selected elements are programmed to respective voltage levels that are at or above the target threshold voltage level; and
stopping programming of the one or more selected memory elements.

31. The method of claim 29, further comprising:
determining that a portion of the selected memory elements are not verified as a pass to the target threshold voltage level;
selecting the portion of unverified memory elements;
dividing the portion of unverified memory elements into a predefined number of subgroups of unverified memory elements based at least in part on respective current threshold voltage levels of the unverified memory elements;

setting respective program parameters for each respective subgroup of unverified memory elements to facilitate applying respective program pulses to the unverified memory elements in the respective subgroups of unverified memory elements;

applying respective program pulses to the unverified memory elements in respective subgroups of unverified memory elements to facilitate programming the unverified memory elements to the target threshold voltage level; and determining whether one or more unverified memory elements are verified as a pass for the target threshold voltage level.

32. The method of claim 31, further comprising:
at least one of:
verifying as a pass one or more previously unverified memory elements for the target threshold voltage level when the one or more previously unverified memory elements respectively has a voltage level that is at or above the target threshold voltage level, and
stopping programming of the one or more memory elements; or
selecting a remaining portion of unverified memory elements,
dividing the remaining portion of unverified memory elements into a predefined number of subsets of respective unverified memory elements based at least in part on respective current voltage levels of the unverified memory elements, and
applying respective program pulses to the unverified memory elements in respective subsets to facilitate programming the unverified memory elements to the target threshold voltage level.

33. The method of claim 28, further comprising:
monitoring one or more parameters related to programming data in the memory;
evaluating the one or more parameters based at least in part on predefined deterministic program criteria; and
determining whether at least one parameter of the one or more parameters at least one of exceeds an applicable predetermined maximum threshold level or is below an applicable predetermined minimum threshold level respectively related the at least one parameter, based at least in part on predefined deterministic program criteria, to facilitate fine tuning programming data in the memory.

34. The method of claim 33, further comprising:
adjusting the at least one parameter or at least one other parameter associated with the at least one parameter when it is determined that the at least one parameter at least one of exceeds the applicable predetermined maximum threshold level or is below the applicable predetermined minimum threshold level respectively related the at least one parameter.

35. The method of claim 33, the one or more parameters comprising or related to at least one of drain voltage; gate voltage; program pulse width; number of subgroups of selected memory elements into which a group of memory elements are divided during a program operation, number of subgroups of unverified memory elements into which unverified memory elements are divided during a program operation, or number of subsets of unverified memory elements into which unverified memory elements are divided during a program operation; threshold voltage level(s) employed with regard to the selected memory elements; target threshold voltage level; number of program verify levels, or corresponding intermediate threshold voltage levels and target threshold voltage level, employed for hybrid deterministic/moving-reference programming during a program operation; programming speed; or number of program pulses applied during a program operation.

36. A method for hybrid deterministic/moving-reference programming of data in a memory, comprising:
dividing a group of memory elements selected for programming into a predefined number of subsets of respective memory elements based at least in part on respective current threshold voltage levels of the selected memory elements;
setting respective program parameters that facilitate generating respective program pulses for the respective subsets based at least in part on the respective current threshold voltage levels of the selected memory elements, wherein each of the respective program pulses when respectively applied to the selected memory elements of the respective subsets facilitate verifying substantially all of the selected memory elements to an applicable program verify level;
applying respective program pulses to the selected memory elements in the respective subsets to facilitate programming the selected memory elements to a target program verify level that corresponds to a target data state.

37. The method of claim 36, further comprising:
determining whether the applicable program verify level is the target program verify level.

38. The method of claim 37, further comprising:
if it is determined that the applicable program verify level is the target program level:
determining whether one or more of the selected memory elements are verified as a pass for the target program verify level;
verifying the one or more of the selected memory elements as a pass for the target program verify level when the one or more of the selected memory elements has a voltage level that is at or above the applicable program verify level; and
ending programming with regard to the one or more of the selected memory elements verified as a pass to the target program verify level.

39. The method of claim 38, further comprising:
selecting a subgroup of memory elements that are not verified as a pass to the target program verify level;
dividing the subgroup of unverified memory elements into a predefined number of subsets of unverified memory elements based at least in part on respective current threshold voltage levels of the unverified memory elements; and
applying respective program pulses to the unverified memory elements in the respective subsets to facilitate programming the unverified memory elements to the target program verify level.

40. The method of claim 39, further comprising:
determining whether one or more of the unverified memory elements are verified as a pass for the target program verify level;
verifying the one or more of the previously unverified memory elements as a pass for the target program verify level when the one or more of the selected memory elements has a voltage level that is at or above the target program verify level; and ending programming with regard to the one or more of the previously unverified memory elements that are verified as a pass to the target program verify level.

41. The method of claim 40, further comprising:

ending programming when all memory elements selected for programming are verified as a pass to the target program verify level.

42. The method of claim 37, further comprising:

if it is determined that the applicable program verify level is not the target program verify level:

adjusting the applicable program verify level to at least one other applicable program verify level;

determining whether one or more of the selected memory elements are verified as a pass for the at least one other program verify level; and verifying the one or more of the selected memory elements as a pass for the at least one other program verify level when the one or more of the selected memory elements has a voltage level that is at or above the at least one other applicable program verify level.

43. The method of claim 42, further comprising:

selecting a subgroup of memory elements that are not verified as a pass to the at least one other program verify level;

dividing the subgroup of unverified memory elements into a predefined number of subsets of unverified memory elements based at least in part on respective current threshold voltage levels of the unverified memory elements;

applying respective program pulses to the unverified memory elements in the respective subsets to facilitate programming the unverified memory elements to the target program verify level; and determining whether the at least one other applicable program verify level is the target program verify level.

44. The method of claim 42, further comprising:

ending programming when all memory elements selected for programming are verified as a pass to the target program verify level.

* * * * *